United States Patent
You

(10) Patent No.: US 9,881,981 B2
(45) Date of Patent: Jan. 30, 2018

(54) METHOD OF MANUFACTURING AN ORGANIC LIGHT EMITTING DISPLAY DEVICE

(71) Applicant: Samsung Display Co., Ltd., Yongin-si, Gyeonggi-do (KR)

(72) Inventor: Chun-Gi You, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/438,709

(22) Filed: Feb. 21, 2017

(65) Prior Publication Data
US 2017/0170249 A1 Jun. 15, 2017

Related U.S. Application Data

(62) Division of application No. 14/733,816, filed on Jun. 8, 2015, now Pat. No. 9,583,549.

(30) Foreign Application Priority Data

Nov. 17, 2014 (KR) .................. 10-2014-0159766

(51) Int. Cl.
*H01L 27/32* (2006.01)
*H01L 51/56* (2006.01)

(52) U.S. Cl.
CPC ...... *H01L 27/3258* (2013.01); *H01L 27/3262* (2013.01); *H01L 27/3265* (2013.01);
(Continued)

(58) Field of Classification Search
CPC . H01L 27/32; H01L 27/3257; H01L 27/3262; H01L 51/56; H01L 2227/323; H01L 27/3237
See application file for complete search history.

(56) References Cited

U.S. PATENT DOCUMENTS

2006/0243980 A1* 11/2006 Lee ................ G02F 1/13458
257/72
2007/0035239 A1* 2/2007 Kang .............. H01L 27/1248
313/504
(Continued)

FOREIGN PATENT DOCUMENTS

KR 10-2011-0069362 A 6/2011
KR 10-2012-0031363 A 4/2012
(Continued)

OTHER PUBLICATIONS

EPO Search Report dated Apr. 18, 2016, for corresponding European Patent application 15176894.2, (9 pages).

*Primary Examiner* — Phuc Dang
(74) *Attorney, Agent, or Firm* — Lewis Roca Rothgerber Christie LLP

(57) ABSTRACT

An organic light emitting display device includes a substrate including a plurality of pixel regions each including a light emitting region and a transparent region, a gate electrode in the light emitting region, a first insulating interlayer covering the gate electrode and extending from the light emitting region to the transparent region, a drain electrode on the first insulating interlayer and constituting a transistor in conjunction with the gate electrode, a planarization layer covering the transistor and exposing a top surface of the first insulating interlayer in the transparent region, and a first electrode on the planarization layer.

6 Claims, 19 Drawing Sheets

(52) U.S. Cl.
CPC ........ *H01L 51/56* (2013.01); *H01L 2227/323* (2013.01); *H01L 2251/301* (2013.01)

(56) References Cited

U.S. PATENT DOCUMENTS

| | | |
|---|---|---|
| 2011/0140115 A1 | 6/2011 | Ahn |
| 2011/0163664 A1 | 7/2011 | Kang et al. |
| 2011/0204369 A1 | 8/2011 | Ha et al. |
| 2011/0205198 A1 | 8/2011 | Jeong et al. |
| 2012/0156100 A1 | 6/2012 | Tsai et al. |
| 2012/0169683 A1 | 7/2012 | Hong |
| 2012/0268696 A1 | 10/2012 | Yim et al. |
| 2013/0175533 A1 | 7/2013 | Lee et al. |
| 2014/0077186 A1* | 3/2014 | Kim .................... H01L 27/3218 257/40 |
| 2014/0183472 A1 | 7/2014 | Kim et al. |
| 2014/0299843 A1 | 10/2014 | Kim |
| 2015/0097172 A1 | 4/2015 | Han et al. |
| 2015/0115234 A1* | 4/2015 | Hong .................... H01L 51/525 257/40 |
| 2015/0179727 A1 | 6/2015 | Kim et al. |
| 2016/0043154 A1* | 2/2016 | Choi .................... H01L 27/3258 257/40 |
| 2016/0079336 A1 | 3/2016 | Youn et al. |

FOREIGN PATENT DOCUMENTS

| | | |
|---|---|---|
| KR | 2014-0083590 | 7/2014 |
| KR | 10-2016-0005230 | 1/2016 |

\* cited by examiner

METHOD OF MANUFACTURING AN ORGANIC LIGHT EMITTING DISPLAY DEVICE

CROSS REFERENCE TO RELATED APPLICATION

This application is a divisional of U.S. patent application Ser. No. 14/733,816, filed Jun. 8, 2015, now U.S. Pat. No. 9,583,549, which claims priority to and the benefit of Korean Patent Application No. 10-2014-0159766, filed Nov. 17, 2014, the entire content of both of which is incorporated herein by reference.

BACKGROUND

1. Field

Aspects of embodiments of the present invention relate to an organic light emitting display device and a method of manufacturing the organic light emitting display device.

2. Description of the Related Art

A transparent organic light emitting display device includes a transparent region that allows light to pass through the display device and enables objects to be seen from behind the display device, such as when the display device operates in an "OFF" state. For example, in the "OFF" state, the organic light emitting display device may display an image in a pixel region adjacent to the transparent region using light generated from an organic light emitting layer thereof. As such, it may be desired for the organic light emitting display device to have enhanced characteristics while ensuring desired transmittance.

SUMMARY

Aspects of embodiments of the present invention relate to an organic light emitting display device and a method of manufacturing the organic light emitting display device. Further aspects are directed to an organic light emitting display device having improved sharpness and a method of manufacturing an organic light emitting display device having improved sharpness.

In example organic light emitting display devices and methods of manufacturing the organic light emitting display devices according to embodiments of the present invention, a gate insulation layer and a first insulating interlayer extend from a light emitting region to a transparent region so that a sidewall of the gate insulation layer and a sidewall of the first insulating interlayer are not disposed in the transparent region. In further embodiments, a pixel defining layer is disposed only in the light emitting region so that a sidewall of the pixel defining layer is not disposed in the transparent region. Accordingly, the sharpness of the organic light emitting display devices may be improved.

In an embodiment of the present invention, an organic light emitting display device is provided. The organic light emitting display device includes a substrate including a plurality of pixel regions each including a light emitting region and a transparent region, a gate electrode in the light emitting region, a first insulating interlayer covering the gate electrode and extending from the light emitting region to the transparent region, a drain electrode on the first insulating interlayer and constituting a transistor in conjunction with the gate electrode, a planarization layer covering the transistor and exposing a top surface of the first insulating interlayer in the transparent region, and a first electrode on the planarization layer.

The organic light emitting display device may further include a pixel defining layer on the planarization layer and partially covering the first electrode. The pixel defining layer may be in the light emitting region and expose the top surface of the first insulating interlayer in the transparent region.

The organic light emitting display device may further include second insulating interlayer patterns on the first insulating interlayer, one of the second insulating interlayer patterns being between the drain electrode and the first insulating interlayer. The second insulating interlayer patterns may include a material that is different from the first insulating interlayer.

The organic light emitting display device may further include a first conductive pattern below the first insulating interlayer and include a material that is identical to a material of the gate electrode, a second conductive pattern on the first insulating interlayer, and a third conductive pattern above the second conductive pattern and including a material that is identical to a material of the drain electrode. Another one of the second insulating interlayer patterns may be between the second conductive pattern and the third conductive pattern.

The second insulating interlayer patterns may include a material that has a higher dielectric constant than a material of the first insulating interlayer, and may have a thickness that is less than a thickness of the first insulating interlayer.

The second insulating interlayer patterns may include silicon nitride. The first insulating interlayer may be a single layer including silicon oxide.

The second insulating interlayer patterns may be in the light emitting region and expose the transparent region.

The first conductive pattern, the second conductive pattern, and the first insulating interlayer therebetween may constitute a first capacitor. The second conductive pattern, the third conductive pattern, and the other one of the second insulating interlayer patterns therebetween may constitute a second capacitor. The first capacitor and the second capacitor may overlap each other when viewed from a direction substantially perpendicular to a top surface of the substrate.

The first capacitor may be a C-hold capacitor and the second capacitor may be a storage capacitor.

In another embodiment of the present invention, an organic light emitting display device is provided. The organic light emitting display device includes a substrate including a plurality of pixel regions each including a light emitting region and a transparent region, a first gate electrode in the light emitting region, a first insulating interlayer covering the first gate electrode and extending from the light emitting region to the transparent region, a second gate electrode in the light emitting region and on the first insulating interlayer, a second insulating interlayer covering the second gate electrode and extending from the light emitting region to the transparent region, a first drain electrode on the second insulating interlayer and constituting a first transistor in conjunction with the first gate electrode, a second drain electrode on the second insulating interlayer and constituting a second transistor in conjunction with the second gate electrode, a planarization layer covering the first transistor and the second transistor, and a first electrode on the planarization layer. The planarization layer exposes a top surface of the second insulating interlayer in the transparent region.

The organic light emitting display device may further include third insulating interlayer patterns on the second insulating interlayer, a first one of the third insulating interlayer patterns being between the first drain electrode and the second insulating interlayer, and a second one of the third insulating interlayer patterns being between the second drain electrode and the second insulating interlayer. The third insulating interlayer patterns may include a material that is different from the second insulating interlayer.

The third insulating interlayer patterns may include silicon nitride. The first insulating interlayer and the second insulating interlayer may include silicon oxide.

The organic light emitting display device may further include a first conductive pattern below the first insulating interlayer and including a material that is identical to a material of the first gate electrode, a second conductive pattern on the first insulating interlayer and including a material that is identical to a material of the first gate electrode, and a third conductive pattern on a third one of the third insulating interlayer patterns and including a material that is identical to a material of the first drain electrode.

The first conductive pattern, the second conductive pattern, and the first insulating interlayer therebetween may constitute a first capacitor. The second conductive pattern, the third conductive pattern, and the second insulating interlayer therebetween may constitute a second capacitor. The first capacitor and the second capacitor may overlap each other when viewed from a direction substantially perpendicular to a top surface of the substrate.

In yet another embodiment of the present invention, a method of manufacturing an organic light emitting display device is provided. The method includes forming a first semiconductor pattern on a substrate including a plurality of pixel regions each including a light emitting region and a transparent region, forming a gate insulation layer to cover the first semiconductor pattern, forming a first gate electrode on the gate insulation layer and partially overlapping the first semiconductor pattern, forming a first insulating interlayer covering the first gate electrode and extending from the light emitting region to the transparent region, forming a first drain electrode and a first source electrode above the first insulating interlayer, forming a planarization layer covering the first drain electrode and the first source electrode, and forming a first electrode on the planarization layer. The first drain electrode and the first source electrode constitute a first transistor in conjunction with the first gate electrode. The planarization layer exposes a top surface of the first insulating interlayer in the transparent region.

The forming of the first gate electrode may further include forming a first conductive pattern on the gate insulation layer.

The forming of the first drain electrode and the first source electrode may further include forming a third conductive pattern overlapping the first conductive pattern.

The method may further include forming a second conductive pattern on the first insulating interlayer and overlapping the first conductive pattern, and forming second insulating interlayer patterns on the first insulating interlayer. One of the second insulating interlayer patterns may cover the second conductive pattern.

The forming of the second insulating interlayer patterns may include forming a second insulating interlayer on the first insulating interlayer using silicon nitride, and partially removing the second insulating interlayer in the light emitting region.

The forming of the planarization layer may include forming an organic layer in the transparent region and the light emitting region, and partially removing the organic layer to form a first opening defined by a top surface of the first insulating interlayer and a sidewall of the organic layer. The organic layer may cover the first drain electrode and the first source electrode.

In further embodiments, a first conductive pattern, a second conductive pattern, a third conductive pattern, and a fourth conductive pattern are disposed to overlap each other so that a first capacitor and a second capacitor overlap each other when viewed from a direction substantially perpendicular to a top surface of the substrate. Accordingly, opening ratios of the organic light emitting display devices may increase.

BRIEF DESCRIPTION OF THE DRAWINGS

Example embodiments of the present invention may be understood in more detail from the following description taken in conjunction with the accompanying drawings in which.

DETAILED DESCRIPTION

Figure 1:
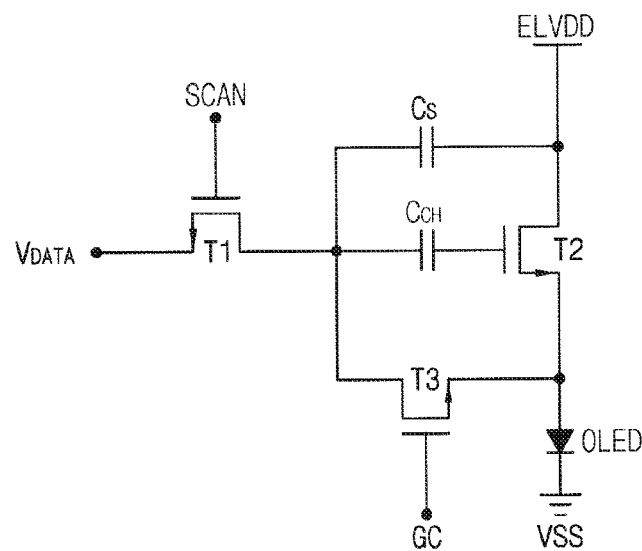
FIG. 1 is a circuit diagram illustrating a pixel of an organic light emitting display device in accordance with an embodiment of the present invention.

Example embodiments of the present invention are described more fully hereinafter with reference to the accompanying drawings. The present invention may, however, be embodied in many different forms and should not be construed as limited to the embodiments set forth herein. In the drawings, the sizes and relative sizes of layers and regions may be exaggerated for clarity.

It will be understood that when an element or layer is referred to as being "on," "connected to," or "coupled to" another element or layer, it may be directly on, connected, or coupled to the other element or layer, or intervening elements or layers may be present. In contrast, when an element is referred to as being "directly on," "directly connected to," or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third, etc., may be used herein to describe various elements, components, regions, layers, patterns, and/or sections, these elements, components, regions, layers, patterns, and/or sections should not be limited by these terms. These terms are used primarily to distinguish one element, component, region, layer, pattern, or section from another element, component, region, layer, pattern, or section. Thus, a first element, component, region, layer, pattern, or section discussed below could be termed a second element, component, region, layer, pattern, or section without departing from the teachings of the present invention.

Spatially relative terms, such as "beneath," "below," "lower," "above," "upper," and the like, may be used herein for ease of description to describe one element or feature's relationship relative to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below relative to other elements or features depending on the orientation in the drawing. The device may be otherwise oriented (e.g., rotated 90 degrees or at other orientations) and the spatially relative descriptors used herein interpreted accordingly.

The terminology used herein is intended primarily for describing particular example embodiments and is not intended to be limiting of the present invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized embodiments (and intermediate structures) of the present invention. As such, variations from the shapes of the illustrations as a result, for example, of manufacturing techniques and/or tolerances, are to be expected. Thus, the present invention should not be construed as limited to the particular shapes of regions illustrated herein but further includes variations or deviations in shapes that result, for example, from manufacturing. The regions illustrated in the figures are schematic in nature and their shapes are not necessarily intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms such as those defined in commonly used dictionaries should be interpreted as having a meaning that is consistent with their meaning in the context of the relevant art and should not be interpreted in an idealized or overly formal sense unless expressly so defined herein.

Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed. Hereinafter, embodiments of the present invention will be described with reference to the accompanying drawings.

The organic light emitting display device and/or any other relevant devices or components according to embodiments of the present invention described herein may be implemented utilizing any suitable hardware, firmware (e.g., an application-specific integrated circuit), software, or a suitable combination of software, firmware, and hardware. For example, the various components of the organic light emitting display device may be formed on one integrated circuit (IC) chip or on separate IC chips. Further, the various components of the organic light emitting display device may be implemented on a flexible printed circuit film, a tape carrier package (TCP), a printed circuit board (PCB), or formed on a same substrate as the organic light emitting display device.

Further, the various components of the organic light emitting display device may be a process or thread, running on one or more processors, in one or more computing devices, executing computer program instructions and interacting with other system components for performing the various functionalities described herein. The computer program instructions are stored in a memory that may be implemented in a computing device using a standard memory device, such as, for example, a random access memory (RAM). The computer program instructions may also be stored in other non-transitory computer readable media such as, for example, a CD-ROM, flash drive, or the like. In addition, a person of skill in the art should recognize that the functionality of various computing devices may be combined or integrated into a single computing device, or the functionality of a particular computing device may be distributed across one or more other computing devices without departing from the scope of the present invention.

FIG. 1 is a circuit diagram illustrating a pixel of an organic light emitting display device in accordance with an embodiment of the present invention;

Referring to FIG. 1, a scan line (for receiving a scan signal SCAN), a data line (for receiving a data signal VData), a power supply line (for transmitting a power supply voltage Vdd from a power supply source ELVDD), another power supply line (for supplying another power supply voltage Vss, such as a ground voltage, from another power supply source VSS), and another scan line (for receiving another scan signal GC) are electrically connected to a pixel circuit for driving an organic light emitting diode (OLED). In other embodiments, other lines may be electrically connected to the pixel circuit depending on a structure of the pixel circuit.

In the embodiment of FIG. 1, the pixel circuit includes a first transistor T1, a second transistor T2, a third transistor T3, a storage capacitor Cst, and a C-hold capacitor Cch. The pixel circuit is electrically connected to the OLED. In more detail, the first transistor T1 is electrically connected to the scan line and the data line, the second transistor T2 is electrically connected to the OLED and the power supply line, and the third transistor T3 is electrically connected to the OLED, the other scan line, and the first transistor T1.

Further, the storage capacitor Cst and the C-hold capacitor Cch are disposed between the first transistor T1 and the second transistor T2. The C-hold capacitor Cch may hold a voltage for driving the gate electrode of the second transistor T2 (driving transistor), while the storage capacitor Cst may store a data voltage supplied from the data line. In addition, the OLED is electrically connected to the driving transistor T2 and the other power supply source VSS.

In the embodiment of FIG. 1, the first transistor T1 is a switching transistor, and the second transistor T2 is a driving transistor. The pixel circuit in FIG. 1 is an example embodiment, and the present invention is not limited thereto. In other embodiments, the pixel circuit may include additional transistors and additional capacitors.

Figure 2:
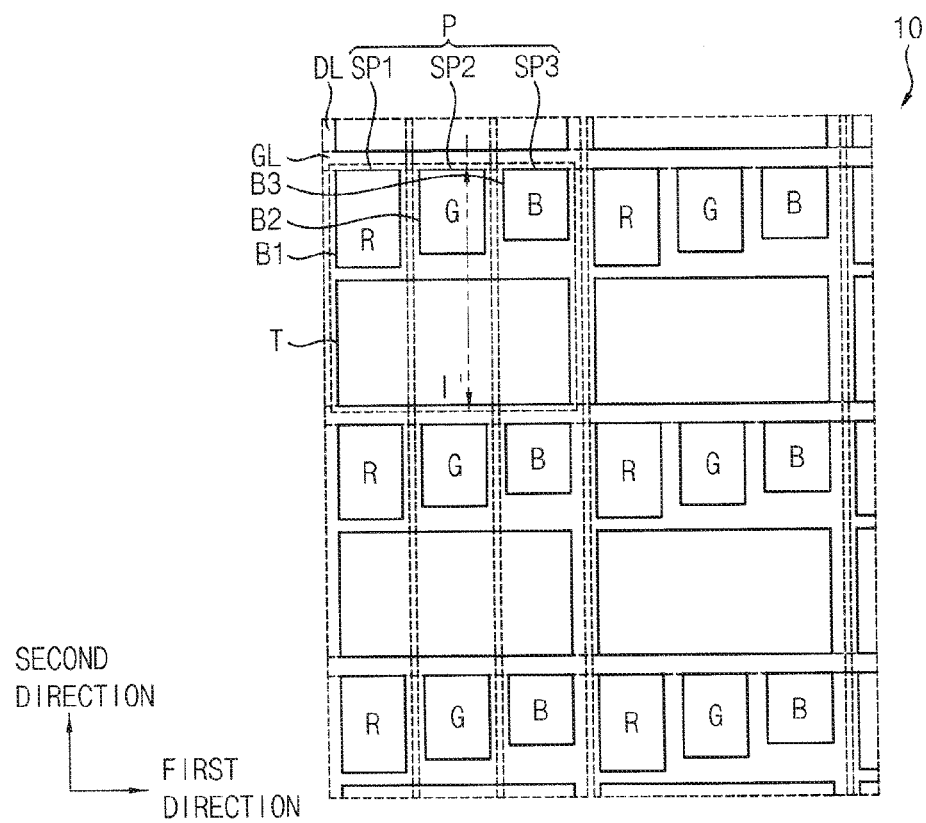
FIG. 2 is a plan view partially illustrating an organic light emitting display device in accordance with an embodiment of the present invention.

FIG. 2 is a plan view partially illustrating an organic light emitting display device 10 in accordance with an embodiment of the present invention.

Referring to FIG. 2, the organic light emitting display device 10 includes a plurality of gate lines GL extending in a first direction and a plurality of data lines DL extending in a second direction crossing the first direction (e.g., perpendicular to the first direction). The organic light emitting display device 10 may also include power lines. The gate lines GL and the data lines DL cross each other to define a plurality of pixel regions P In the embodiment of FIG. 2, each of the pixel regions P includes a plurality of sub-pixel regions SP1, SP2, SP3. In more detail, each of the sub-pixel regions SP1, SP2, SP3 is divided into a transparent region T and one of a corresponding plurality of light emitting regions B1, B2, B3. The transparent region T may occupy a ratio in the range of about 25% to about 85% of an area of the pixel region P (such as a total area of sub-pixel regions SP1, SP2, SP3).

When the organic light emitting display device 10 is switched off, the organic light emitting display device 10 may be transparent enough to permit an environment behind the organic light emitting display device 10 to be viewed through the transparent region T. When the organic light emitting display device 10 is switched on, the organic light emitting display device may display images through the light emitting regions B1, B2, B3. In some embodiments, the organic light emitting display device 10 may be transparent enough to permit an environment behind the organic light emitting display device 10 to be viewed while the organic light emitting display device 10 is switched on or while the organic light emitting display device 10 is displaying images through the light emitting regions B1, B2, B3.

If the transparent region T occupies a ratio below about 25% of the area of the pixel region P, the transparency of the organic light emitting display device may degrade below acceptable limits. If the transparent region T occupies a ratio above about 85% of the area of the pixel region P, areas of the light emitting regions B1, B2, B3 may decrease to the point that it is hard for the organic light emitting display device 10 to adequately display images. Therefore, when the transparent region T occupies a ratio in the range of about 25% to about 85% of the area of the pixel region P, the organic light emitting display device may have a desired transparency while also being able to adequately display images.

Further, pixel circuits may be disposed at each of the light emitting regions B1, B2, B3 of the sub pixel regions SP1, SP2, SP3, where the gate lines GL and the data lines DL cross each other. The driving circuits may be, for example, similar or substantially identical to those described above with reference to FIG. 1.

In the embodiment of FIG. 2, in each pixel region P, the light emitting regions include a first light emitting region B1 of the first sub pixel region SP1, a second light emitting region B2 of the second sub pixel region SP2, and a third light emitting region B3 of the third sub pixel region SP3. However, the present invention is limited thereto. In other embodiments, each of the pixel regions P may include a different number of sub pixel regions, such as two sub pixel regions or four sub pixel regions.

In the embodiment of FIG. 2, an OLED disposed in the first light emitting region B1 in the first sub pixel region SP1 emits a red (R) color of light, an OLED disposed in the second light emitting region B2 in the second sub pixel region SP2 emits a green (G) color of light, and an OLED disposed in the third light emitting region B3 in the third sub pixel region SP3 emits a blue (B) color of light.

Figure 3:
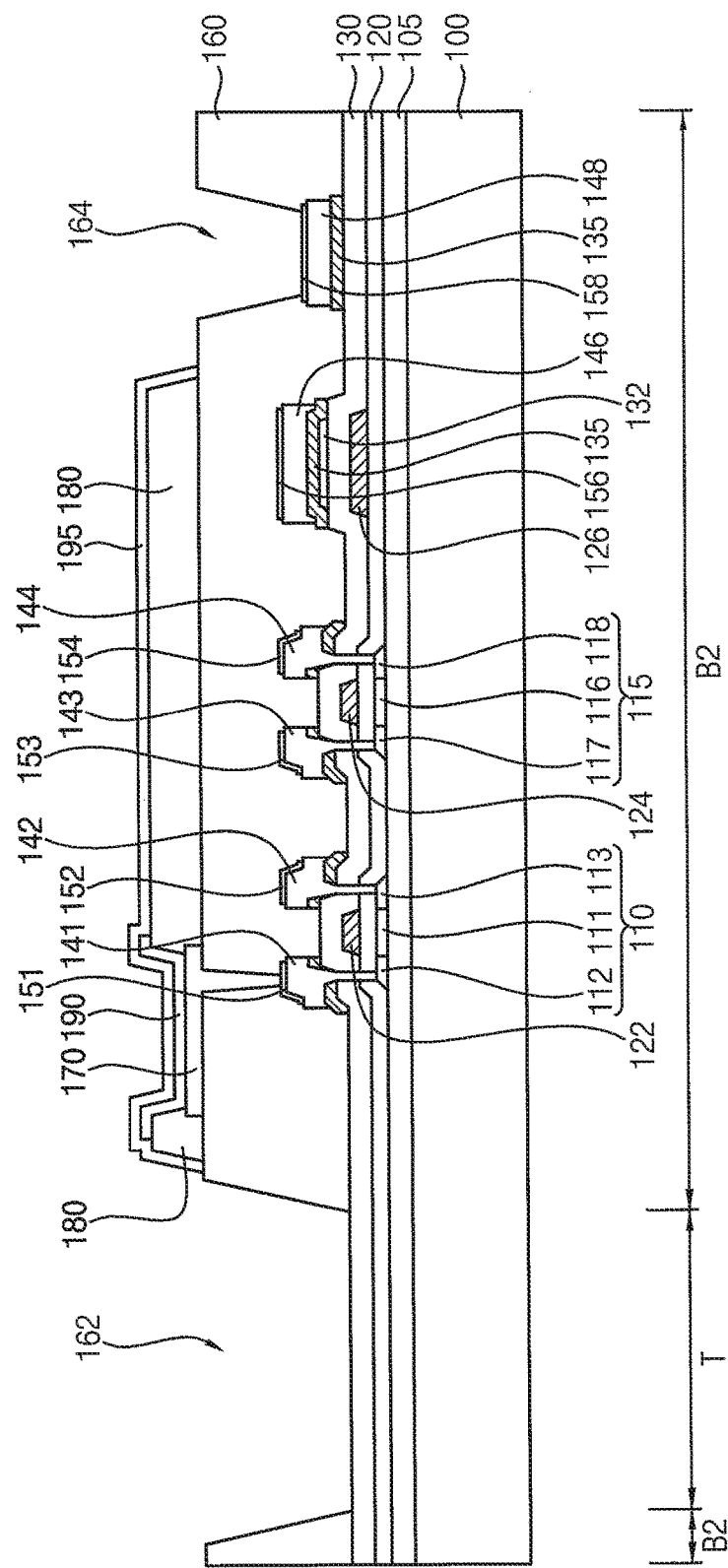
FIG. 3 is a cross sectional view illustrating an example of the organic light emitting display device of FIG. 2 taken along line I-I' in accordance with an embodiment of the present invention.

FIG. 3 is a cross sectional view illustrating an example of the organic light emitting display device 10 of FIG. 2 as taken along line I-I' in accordance with an embodiment of the present invention.

Referring to FIG. 3, the organic light emitting display device 10 includes a substrate 100, transistors, capacitors, a first electrode 170, an organic layer structure 190, and a second electrode 195. The substrate 100 may include a transparent insulation substrate. For example, the substrate 100 may include a glass substrate, a quartz substrate, a transparent resin substrate, etc. In other embodiments, the substrate 100 may be a flexible substrate.

In the embodiment of FIG. 3, the substrate 100 is divided into a transparent region T and a light emitting region B2. Each of the pixel regions P may include a plurality of sub pixel regions, each of which may include a light emitting region, such as a second light emitting region B2, as illustrated in FIG. 2.

In FIG. 3, a barrier layer 105 is disposed on the substrate 100. The barrier layer 105 may provide a flat top surface, and may prevent impurities from diffusing into the substrate 100. The barrier layer 105 may include an inorganic material, an organic material, or a stacked structure thereof. The inorganic material may include, for example, silicon oxide, silicon nitride, silicon oxy nitride, aluminum oxide, aluminum nitride, titanium oxide, or titanium nitride, while the organic material may include polyimide, polyester, or acryl.

In other embodiments, the barrier layer 105 may have a stacked structure including at least one organic layer and at least one inorganic layer. In still other embodiments, the barrier layer 105 may be omitted.

In FIG. 3, a first semiconductor pattern 110 and a second semiconductor pattern 115 are disposed on the barrier layer 105. The first and second semiconductor patterns 110 and 115 are disposed in the light emitting region B2, and are not disposed in the transparent region T.

The first and second semiconductor patterns 110 and 115 may include oxide semiconductor, polysilicon, doped polysilicon, amorphous silicon, doped amorphous silicon, or the like. In some embodiments, the first and second semiconductor patterns 110 and 115 may include a binary compound $(AB_x)$, a ternary compound $(AB_xC_y)$, a quaternary compound $(AB_xC_yO_z)$, etc., which may contain indium (In), zinc (Zn), gallium (Ga), tin (Sn), titanium (Ti), aluminum (Al), hafnium (Hf), zirconium (Zr), magnesium (Mg), etc. These may be used alone or in a mixture thereof. For example, the first and second semiconductor patterns 110 and 115 may include a G-I—Z—O layer $[(In_2O_3)_a(Ga_2O_3)_b(ZnO)_c$ layer], wherein a, b, and c are each a real number satisfying $a \geq 0$, $b \geq 0$, $c > 0$.

In the embodiment of FIG. 3, the first semiconductor pattern 110 includes a first source region 113, a first drain region 112, and a first channel region 111 disposed therebetween. Further, the second semiconductor pattern 115 includes a second source region 118, a second drain region 117, and a second channel region 116 disposed therebetween.

In FIG. 3, a gate insulation layer 120 is disposed on the barrier layer 105 to cover the first and second semiconductor patterns 110 and 115. The gate insulation layer 120 may include, for example, silicon oxide, silicon nitride, or a high k-dielectric material. In some embodiments, the gate insulation layer 120 may be a single layer including silicon oxide and having a thickness in a range of about 800 Å to about 1200 Å.

In FIG. 3, first and second gate electrodes 122 and 124, and a first conductive pattern 126 are disposed on the gate insulation layer 120. The first gate electrode 122 overlaps the first channel region 111 of the first semiconductor pattern 110 and the second gate electrode 124 overlaps the second channel region 116 of the second semiconductor pattern 115. Further, the first conductive pattern 126 is disposed in the light emitting region B2, and is not disposed in the transparent region T.

In FIG. 3, a first insulating interlayer 130 is disposed on the gate insulation layer 120 to cover the first and second gate electrodes 122 and 124, and the first conductive pattern 126. The first insulating interlayer 130 may include, for example, silicon oxide. A second conductive pattern 132 is disposed on the first insulating interlayer 130 to overlap the first conductive pattern 126. The second conductive pattern 132 may include, for example, a metal such as aluminum (Al), copper (Cu), tungsten (W), chromium (Cr), or a conductive metal oxide such as indium tin oxide (ITO). In some embodiments, the second conductive pattern 132 may have a thickness that is smaller than those of the first and second gate electrodes 122 and 124.

The first conductive pattern 126, the second conductive pattern 132, and the first insulating interlayer 130 disposed therebetween may constitute a first capacitor. For example, in some embodiments, the first capacitor may be the storage capacitor or the C-hold capacitor described above with reference to FIG. 2.

In FIG. 3, second insulating interlayer patterns 135 are disposed on the first insulating interlayer 130. The second insulating interlayer patterns 135 are disposed to correspond to the first and second semiconductor patterns 110 and 115, and the second conductive pattern 132. In some embodiments, the second insulating interlayer patterns 135 may have a thickness that is smaller than that of the first insulating interlayer 130. In some embodiments, the second insulating interlayer patterns 135 include a material that has a higher dielectric constant than a material of the first insulating interlayer 130. The second insulating interlayer patterns 135 may include, for example, silicon nitride.

In FIG. 3, a first source electrode 142 and 152, a first drain electrode 141 and 151, a second source electrode 144 and 154, a second drain electrode 143 and 153, and third, fourth, fifth, and sixth conductive patterns 146, 156, 148, and 158 are disposed to correspond to the second insulating interlayer patterns 135. The first source electrode 142 and 152, and the first drain electrode 141 and 151 may constitute a first transistor in conjunction with the first semiconductor pattern 110 and the first gate electrode 122. The second source electrode 144 and 154 and the second drain electrode 143 and 153 may constitute a second transistor in conjunction with the second semiconductor pattern 115 and the second gate electrode 124. For example, the first transistor may be the driving transistor described above with reference to FIG. 2, and the second transistor may be the switching transistor described above with reference to FIG. 2.

The first and second transistors illustrated in FIG. 3 have a top gate structure in which the first and second gate electrodes 122 and 124 are disposed above the first and second semiconductor patterns 110 and 115. However, the present invention is not limited thereto. In other embodiments, for example, the first and second transistors may have a bottom gate structure in which the semiconductor patterns are disposed above the gate electrodes.

In FIG. 3, the third conductive pattern 146 and the fourth conductive pattern 156 are disposed on one of the second insulating interlayer patterns 135 to overlap the second conductive pattern 132. The third and fourth conductive patterns 146 and 156, the second conductive pattern 132, and the second insulating interlayer pattern 135 disposed therebetween may constitute a second capacitor. When the second insulating interlayer pattern 135 includes silicon nitride, the second capacitor may have a higher capacitance than when the second insulating interlayer pattern 135 includes silicon oxide. Further, the second insulating interlayer pattern 135 may have a thickness smaller than that of the first insulating interlayer 130, so that the second capacitor may have a capacitance higher than that of the first capacitor. In addition, in some embodiments, the second insulating interlayer pattern 135 includes a material that has a higher dielectric constant than a material of the first insulating interlayer 130.

For example, in some embodiments, the second capacitor may be the storage capacitor or the C-hold capacitor described above with reference to FIG. 2. For example, when the first capacitor is the C-hole capacitor, the second capacitor may be the storage capacitor. In other embodiments, when the second capacitor is the storage capacitor, the first capacitor may be the C-hold capacitor.

In FIG. 3, the fifth conductive pattern 148 and the sixth conductive pattern 158 are disposed on one of the second insulating interlayer patterns 135. The fifth conductive pattern 148 and the sixth conductive pattern 158 may serve as a contact pad for the data line DL, the gate line GL, or the power line described above with reference to FIG. 2.

In some embodiments, the second insulating interlayer patterns 135 may be disposed only where the first source electrode 142 and 152, the first drain electrode 141 and 151, the second source electrode 144 and 154, the second drain electrode 143 and 153, and the third, fourth, fifth, and sixth conductive patterns 146, 156, 148, and 158 are disposed. The second insulating interlayer patterns 135 may only partially cover the light emitting region B2, so that a transparency of the organic light emitting display device may be improved from about 3% to about 5%.

Referring now to FIG. 3, a planarization layer 160 is disposed in the light emitting region B2 of the substrate 100 to cover the transistors and the capacitors. Further, the planarization layer 160 is not disposed in the transparent region T.

In the embodiment of FIG. 3, a first opening 162 is disposed in the transparent region T of the substrate 100, penetrating the planarization layer 160 to expose the first insulating interlayer 130. Further, a second opening 164 penetrates the planarization layer 160 in the light emitting region B2 to expose the sixth conductive pattern 158.

In FIG. 3, the first opening 162 is defined by a top surface of the first insulating interlayer 130 and an exposed sidewall of the planarization layer 160. The first insulating interlayer 130 and the gate insulation layer 120 extend from the light emitting region B2 to the transparent region T. Further, a sidewall of the first insulating interlayer 130 and a sidewall of the gate insulation layer 120 are not disposed in the transparent region T, so that sharpness of the organic light emitting display device may be improved as described below with reference to FIGS. 3 to 7.

In FIG. 3, the first electrode 170 is disposed on the planarization layer 160. The first electrode 170 penetrates the planarization layer 160 to be electrically connected to the first drain electrode 141 and 151. The first electrode 170 may include, for example, a transparent conductive material such as indium tin oxide (ITO), indium zinc oxide (IZO), etc.

In FIG. 3, a pixel defining layer 180 is disposed on the planarization layer 160 to partially cover the first electrode 170. The pixel defining layer 180 may include, for example, an organic material such as polyimide.

In the embodiment of FIG. 3, the pixel defining layer 180 is disposed in the pixel region P and is not disposed in the transparent region T. As such, the pixel defining layer 180 is not disposed on a bottom surface or a sidewall of the first opening 162. Accordingly, a sidewall of the pixel defining layer 180 is not disposed in the transparent region T so that sharpness of the organic light emitting display device may be improved as described with reference to FIGS. 3 to 7.

The organic layer structure 190 may include an organic light emitting layer. In some embodiments, the organic layer structure 190 may further include a hole injection layer, a hole transfer layer, an electrode injection layer, and an electrode transfer layer, or combinations thereof.

In FIG. 3, the second electrode 195 is disposed on the organic layer structure 190 and the pixel defining layer 180. The second electrode 195 may include, for example, aluminum (Al), platinum (Pt), silver (Ag), gold (Au), magnesium (Mg), chromium (Cr), tungsten (W), molybdenum (Mo), titanium (Ti), or an alloy thereof. The second electrode 195 may have a relatively small thickness, so that the second electrode 195 may have a relatively high transparency.

In the embodiment of FIG. 3, the second electrode 195 is disposed in the light emitting region B2 and not in the transparent region T. In other embodiments, the second electrode 195 is disposed in the light emitting region B2 and the transparent region T.

According to the embodiment of FIG. 3, the gate insulation layer 120 and the first insulating interlayer 130 extend from the light emitting region B2 to the transparent region T so that a sidewall of the gate insulation layer 120 and a sidewall of the first insulating interlayer 130 are not disposed in the transparent region T. Further, the pixel defining layer 180 is disposed only in the light emitting region B2 so that a sidewall of the pixel defining layer 180 is not disposed in the transparent region T. Accordingly, the sharpness of the organic light emitting display device may be improved. Further, the first conductive pattern 126, the second conductive pattern 132, the third conductive pattern 146, and the fourth conductive pattern 156 are disposed to overlap each other so that the first capacitor and the second capacitor overlap each other. Accordingly, an opening ratio of the organic light emitting display device may increase.

Figure 4:
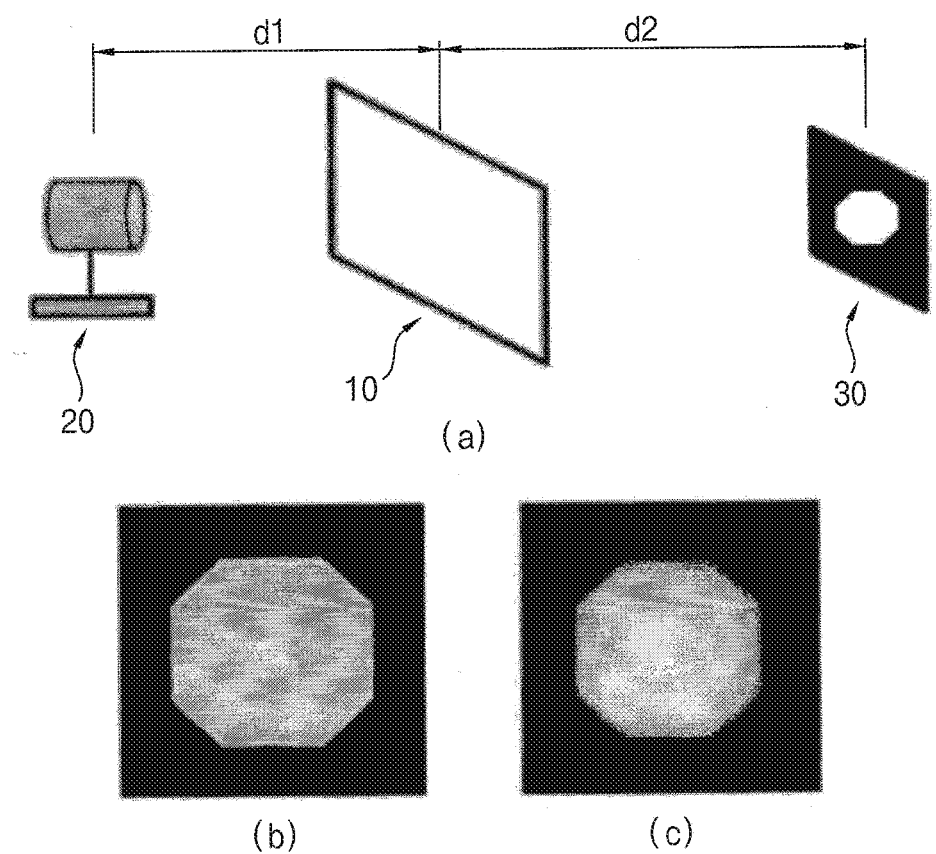
FIG. 4 is a schematic view illustrating a test for measuring sharpness of an organic light emitting display device.

FIG. 4 is a schematic view illustrating a test for measuring sharpness of an organic light emitting display device 10. In more detail, FIG. 4(a) is a schematic view illustrating a test for measuring sharpness of an organic light emitting display device 10, FIG. 4(b) is an original image of a light source, and FIG. 4(c) is a penetrated image passing through the organic light emitting display device.

Referring to FIG. 4(a), light having an original image is radiated from a light source 20 to the organic light emitting display device 10. The light passing through the organic light emitting display device 10 forms a penetrated image on a surface of a target 30. In this case, a first distance (d1) between the light source 20 and the organic light emitting display device 10 may be about 0.5 m, and a second distance (d2) between the organic light emitting display device 10 and the target 30 may be about 1 m.

Referring to FIG. 4(b), the original image has a sharp boundary line (e.g., border, perimeter) having an octagonal form. Meanwhile, referring to FIG. 4(c), the penetrated image has a blurred boundary. Since the boundary is unclear, the organic light emitting display device 10 has a lower sharpness than that of FIG. 4(b).

The sharpness of the organic light emitting display device may be quantified by the above test. As a baseline, the original image has a sharpness of zero, and as the sharpness of the penetrated image gets closer to zero, the organic light emitting display device has an improved sharpness. That is, a sharpness of zero represents ideal or near ideal sharpness, with the sharpness steadily degrading as the measured sharpness (blurriness) increases. Table 1 shows sharpness test results of organic light emitting display devices in accordance with an example embodiment and comparable organic light emitting display devices.

TABLE 1

|  | Sharpness |
| --- | --- |
| Original image | 0 |
| Example embodiment 1 | 1.2 |
| Comparable display device 1 | 1.6 |
| Comparable display device 2 | 1.6 |

The organic light emitting display device in accordance with example embodiment 1 is substantially similar to that described above with reference to FIG. 3. The comparable organic light emitting display device 1 is substantially similar to that described below with reference to FIG. 5, and the comparable organic light emitting display device 2 is substantially similar to that described below with reference to FIG. 6.

Figure 5:
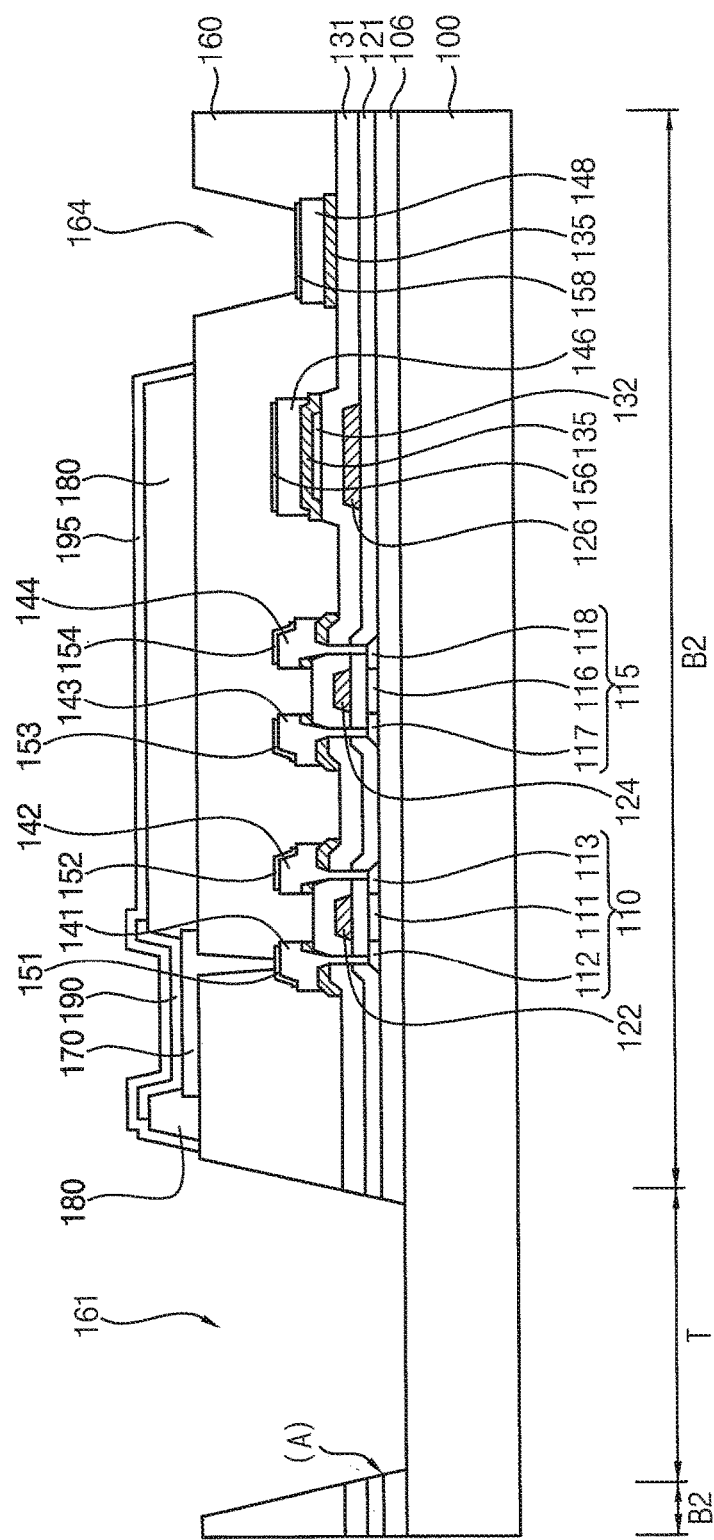
FIG. 5 is a cross sectional view illustrating a comparable organic light emitting display device.

FIG. 5 is a cross sectional view illustrating a comparable organic light emitting display device. The organic light emitting display device may be substantially similar to that described above with reference to FIG. 3 except for a first opening 161, a barrier layer 106, a gate insulation layer 121, and a first insulating interlayer 131.

In FIG. 5, the first opening 161 is disposed to penetrate the planarization layer 160, the barrier layer 106, the gate insulation layer 121, and the first insulating interlayer 131. Therefore, the first opening 161 is defined by a top surface of the substrate 100 and sidewalls of the planarization layer 160, the barrier layer 106, the gate insulation layer 121, and the first insulating interlayer 131. Therefore, the transparent region T is divided into a first area where sidewalls of the barrier layer 106, the gate insulation layer 121, and the first insulating interlayer 131 are disposed and a second area where the barrier layer 106, the gate insulation layer 121, and the first insulating interlayer 131 are not disposed. That is, sidewalls A of the barrier layer 106, the gate insulation layer 121, and the first insulating interlayer 131 are disposed in the transparent region T.

As shown above in Table 1, sidewalls A of the barrier layer 106, the gate insulation layer 121, and the first insulating interlayer 131 may degrade sharpness of the organic light emitting display device.

Figure 6:
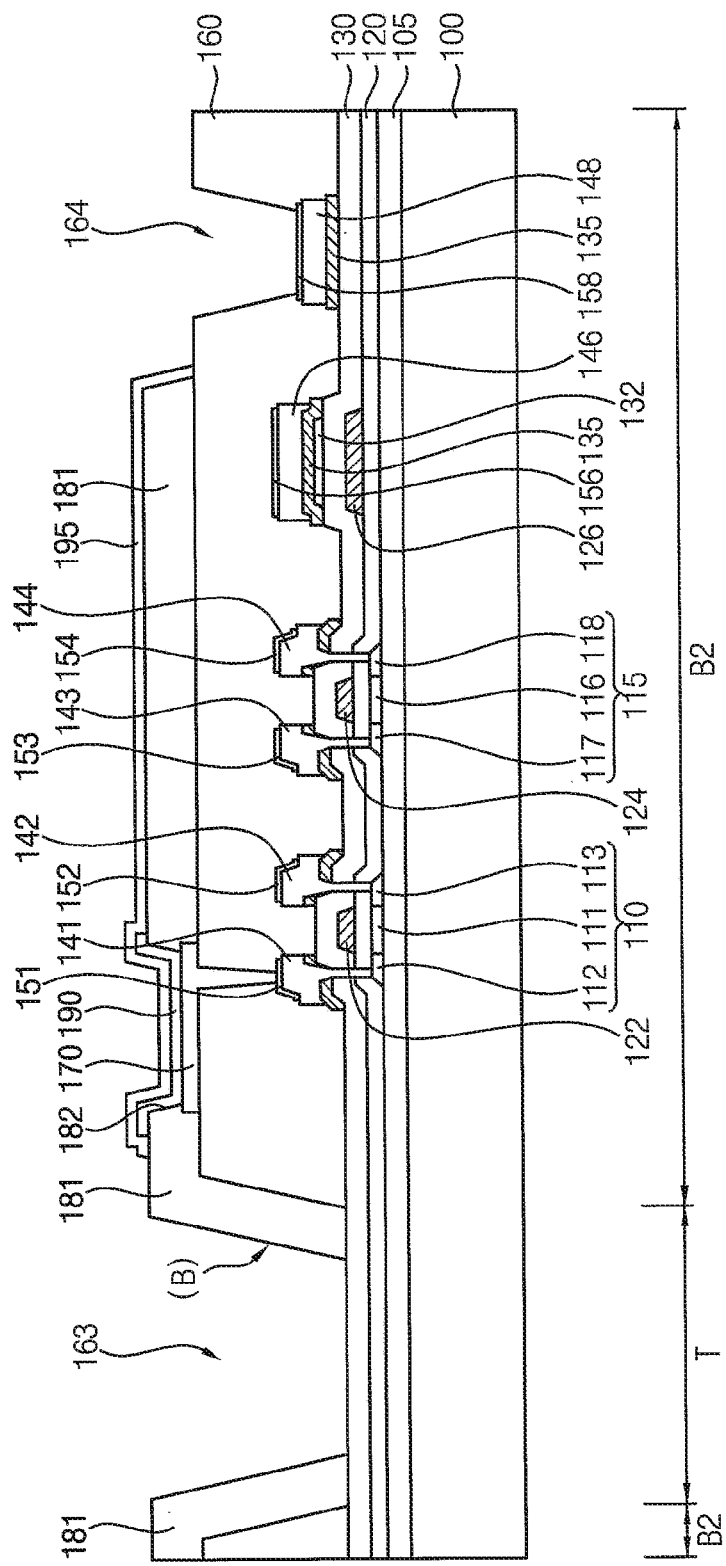
FIG. 6 is a cross sectional view illustrating another comparable organic light emitting display device.

FIG. 6 is a cross sectional view illustrating another comparable organic light emitting display device. The organic light emitting display device is substantially similar to that described above with reference to FIG. 3 except for a pixel defining layer 181.

In FIG. 6, the pixel defining layer 181 is disposed on a top surface of the planarization layer 160 and a sidewall of the first opening 163. Therefore, the transparent region T is divided into a first area where a sidewall of the pixel defining layer 181 is disposed and a second area where the pixel defining layer 181 is not disposed. As such, a sidewall B of the pixel defining layer 181 is disposed in the transparent region T.

As shown above in Table 1, sidewall B of the pixel defining layer 181 may degrade sharpness of the organic light emitting display device.

Figure 7:
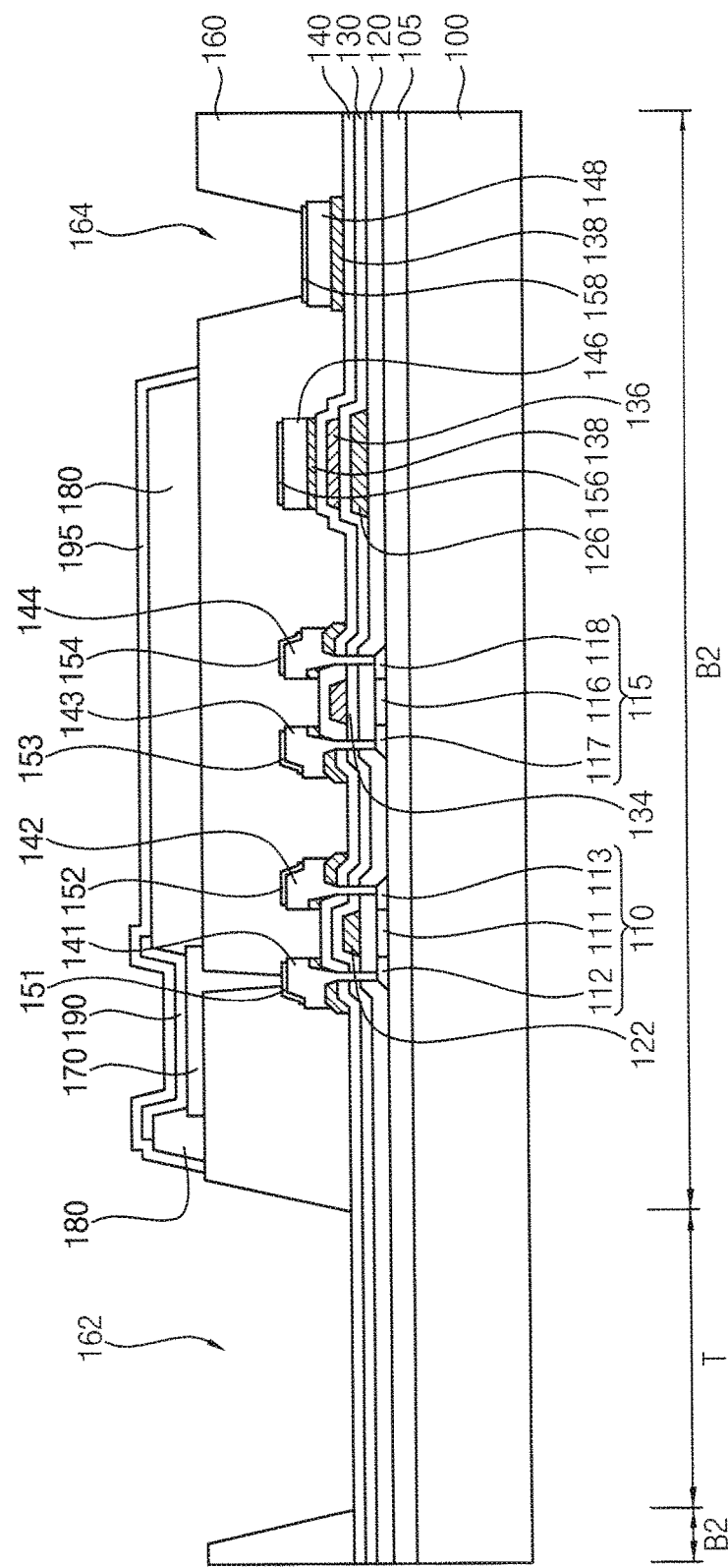
FIG. 7 is a cross sectional view illustrating another organic light emitting display device in accordance with an embodiment of the present invention.

FIG. 7 is a cross sectional view illustrating another organic light emitting display device in accordance with an embodiment of the present invention. The organic light emitting display device is substantially similar to that described above with reference to FIG. 3 except for a second insulating interlayer 140, third insulating interlayer patterns 138, a second gate electrode 134, and a second conductive pattern 136.

In FIG. 7, the substrate 100 is divided into a transparent region T and a light emitting region B2 as illustrated in FIG. 2. A barrier layer 105 is disposed on the substrate 100. The barrier layer 105 may provide a flat top surface, and may prevent impurities from diffusing into the substrate 100.

In FIG. 7, a first semiconductor pattern 110 and a second semiconductor pattern 115 are disposed on the barrier layer 105. In the embodiment of FIG. 7, the first semiconductor pattern 110 includes a first source region 113, a first drain region 112, and a first channel region 111 disposed therebetween. Further, the second semiconductor pattern 115 includes a second source region 118, a second drain region 117, and a second channel region 116 disposed therebetween.

In FIG. 7, a gate insulation layer 120 is disposed on the barrier layer 105 to cover the first and second semiconductor patterns 110 and 115. A first gate electrode 122 and a first conductive pattern 126 are disposed on the gate insulation layer 120. In some embodiments, the first gate electrode 122 and the first conductive pattern 126 may have an identical thickness, and may include an identical material.

In FIG. 7, a first insulating interlayer 130 is disposed on the gate insulation layer 120 to cover the first gate electrode 122 and the first conductive pattern 126. A second gate electrode 134 and a second conductive pattern 136 are disposed on the first insulating interlayer 130. In some embodiments, the second gate electrode 134 and the second conductive pattern 136 may have an identical thickness, and may include an identical material. The first conductive pattern 126, the second conductive pattern 136, and the first insulating interlayer 130 disposed therebetween may constitute a first capacitor.

Referring now to FIG. 7, a planarization layer 160 is disposed in the light emitting region B2 of the substrate 100 to cover the transistors and the capacitors. The planarization layer 160 is not disposed in the transparent region T.

In the embodiment of FIG. 7, a first opening 162 is defined by a top surface of the first insulating interlayer 130 and an exposed sidewall of the planarization layer 160. The first insulating interlayer 130 and the gate insulation layer 120 extend from the light emitting region B2 to the transparent region T. As such, a sidewall of the first insulating interlayer 130 and a sidewall of the gate insulation layer 120 are not disposed in the transparent region T, so that sharpness of the organic light emitting display device may be improved as described with reference to FIGS. 3 to 7.

In FIG. 7, the first electrode 170 is disposed on the planarization layer 160. The first electrode 170 penetrates the planarization layer 160 to be electrically connected to the first drain electrode 141 and 151. A pixel defining layer 180 is disposed on the planarization layer 160 to partially cover the first electrode 170. The pixel defining layer 180 may include, for example, an organic material such as polyimide.

In the embodiment of FIG. 7, the pixel defining layer 180 is disposed in the pixel region P, and is not disposed in the transparent region T. Accordingly, the pixel defining layer 180 is not disposed on a bottom surface or a sidewall of the first opening 162. As such, a sidewall of the pixel defining layer 180 is not disposed in the transparent region T, so that sharpness of the organic light emitting display device may be improved as described with reference to FIGS. 3 to 7.

FIGS. 8 to 14 are cross sectional views illustrating a method of manufacturing an organic light emitting display device in accordance with an embodiment of the present invention. In more detail, FIGS. 8 to 14 are cross sectional views cut along line I-I' of FIG. 2.

Figure 8:
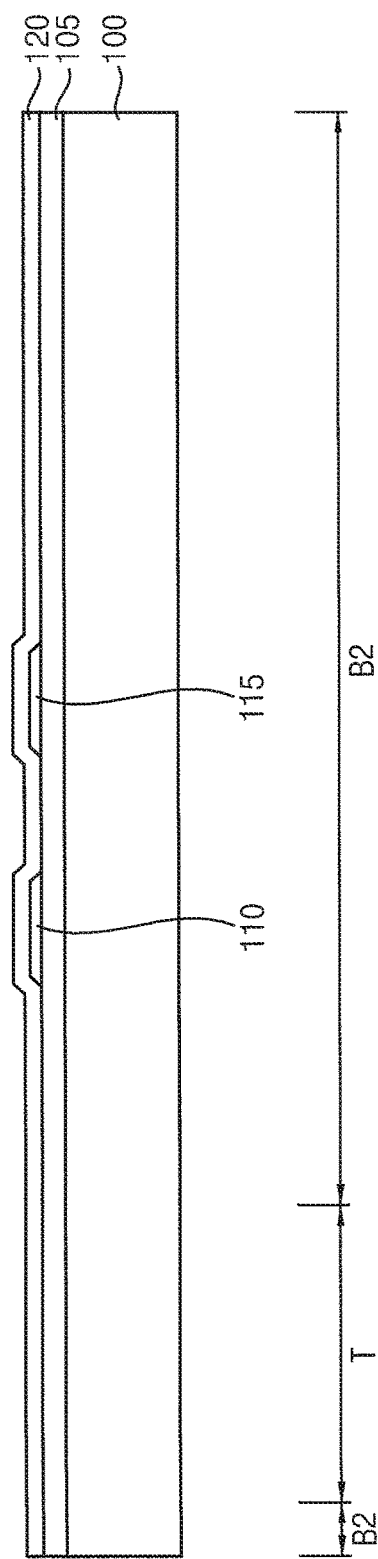
FIGS. 8 to 14 are cross sectional views illustrating a method of manufacturing an organic light emitting display device in accordance with an embodiment of the present invention.

Referring to FIG. 8, a barrier layer 105, first and second semiconductor patterns 110 and 115, and a gate insulation layer 120 are formed on a substrate 100. The substrate 100 may include a transparent insulation substrate. For example, the substrate 100 may include a glass substrate, a quartz substrate, a transparent resin substrate, etc. In other embodiments, the substrate 100 may be a flexible substrate. In the embodiment of FIGS. 8 to 14, the substrate 100 is divided into a transparent region T and a light emitting region B2 as also illustrated in FIG. 2.

In FIG. 8, the barrier layer 105 is formed on the substrate 100. The barrier layer 105 may provide a flat top surface, and may prevent impurities from diffusing into the substrate 100. The barrier layer 105 may be formed, for example, using an inorganic material, an organic material, or a stacked structure thereof. The inorganic material may include, for example, silicon oxide, silicon nitride, silicon oxy nitride, aluminum oxide, aluminum nitride, titanium oxide, or titanium nitride, and the organic material may include, for example, polyimide, polyester, or acryl.

In other embodiments, the barrier layer 105 may have a stacked structure including at least one organic layer and at least one inorganic layer. In still other embodiments, the barrier layer 105 may be omitted.

In FIG. 8, the first semiconductor pattern 110 and the second semiconductor pattern 115 are formed on the barrier layer 105. In more detail, a semiconductor layer may be formed on the barrier layer 105, and the semiconductor layer may be partially removed to form the first semiconductor pattern 110 and the second semiconductor pattern 115. In the embodiment of FIG. 8, the first and second semiconductor patterns 110 and 115 are disposed in the light emitting region B2, and are not disposed in the transparent region T.

The first and second semiconductor patterns 110 and 115 may be formed, for example, using oxide semiconductor, polysilicon, doped polysilicon, amorphous silicon, doped amorphous silicon, or the like. In more detail, the first and second semiconductor patterns 110 and 115 may be formed, for example, by depositing an amorphous silicon layer, and crystallizing the amorphous silicon layer. In other embodiments, the first and second semiconductor patterns 110 and 115 may be formed, for example, using oxide semiconductor by a sputtering process or a chemical vapor deposition (CVD) process.

In FIG. 8, the gate insulation layer 120 is formed on the barrier layer 105 to cover the first and second semiconductor patterns 110 and 115. The gate insulation layer 120 may be formed, for example, using silicon oxide, silicon nitride, or a high k-dielectric material. When the gate insulation layer 120 includes silicon oxide, an interface between the gate insulation layer 120 and the first and second semiconductor patterns 110 and 115 may be chemically stable.

Figure 9:
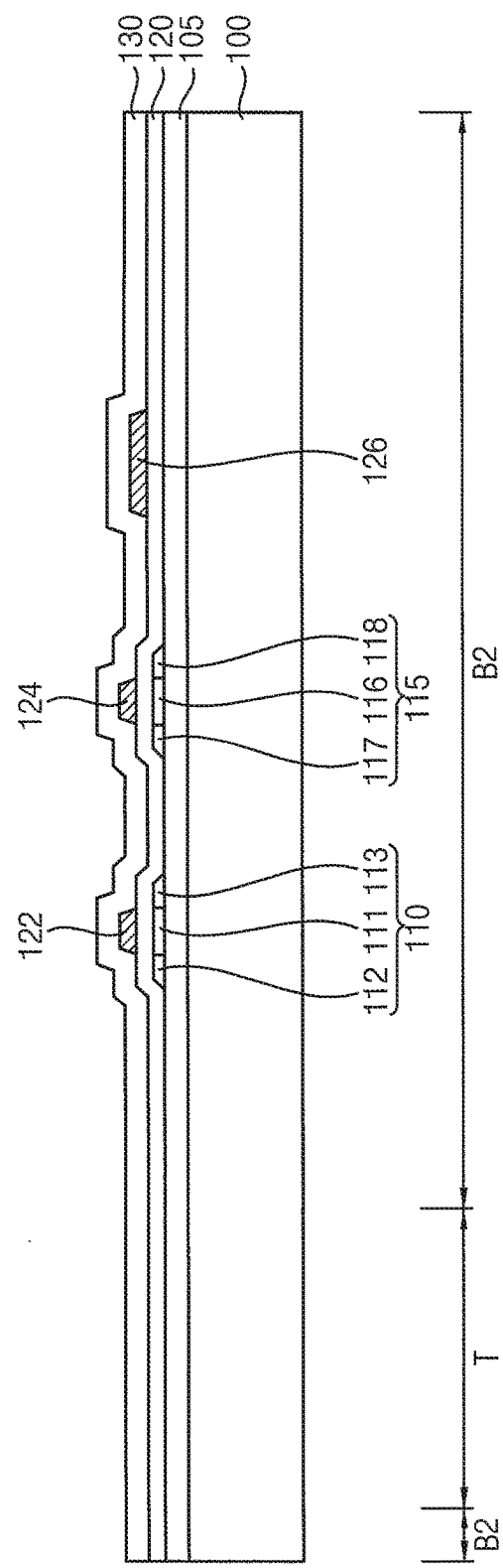

Referring to FIG. 9, first and second gate electrodes 122 and 124 and a first conductive pattern 126 are formed on the gate insulation layer 120. In more detail, a first conductive layer may be formed on the gate insulation layer 120, and the first conductive layer may be partially removed to concurrently (e.g., simultaneously) form the first gate electrode 122, the second gate electrode 124, and the first conductive pattern 126. In the embodiment of FIG. 9, the first gate electrode 122 may partially overlap the first semiconductor pattern 110, and the second gate electrode 124 may partially overlap the second semiconductor pattern 115.

Then, a first insulating interlayer 130 may be formed on the gate insulation layer 120 to cover the first and second gate electrodes 122 and 124 as well as the first conductive pattern 126 by, for example, a CVD process. The first insulating interlayer 130 may be formed, for example, using silicon oxide. In some embodiments, the first insulating interlayer 130 and the gate insulation layer 120 may include an identical material.

Impurities may be implanted into the first and second semiconductor patterns 110 and 115 by using the first and second gate electrodes 122 and 124 as an ion implantation mask. As such, in FIG. 9, the first semiconductor pattern 110 includes a first source region 113, a first drain region 112, and a first channel region 111 disposed therebetween. Further, the second semiconductor pattern 115 includes a second source region 118, a second drain region 117, and a second channel region 116 disposed therebetween.

Figure 10:
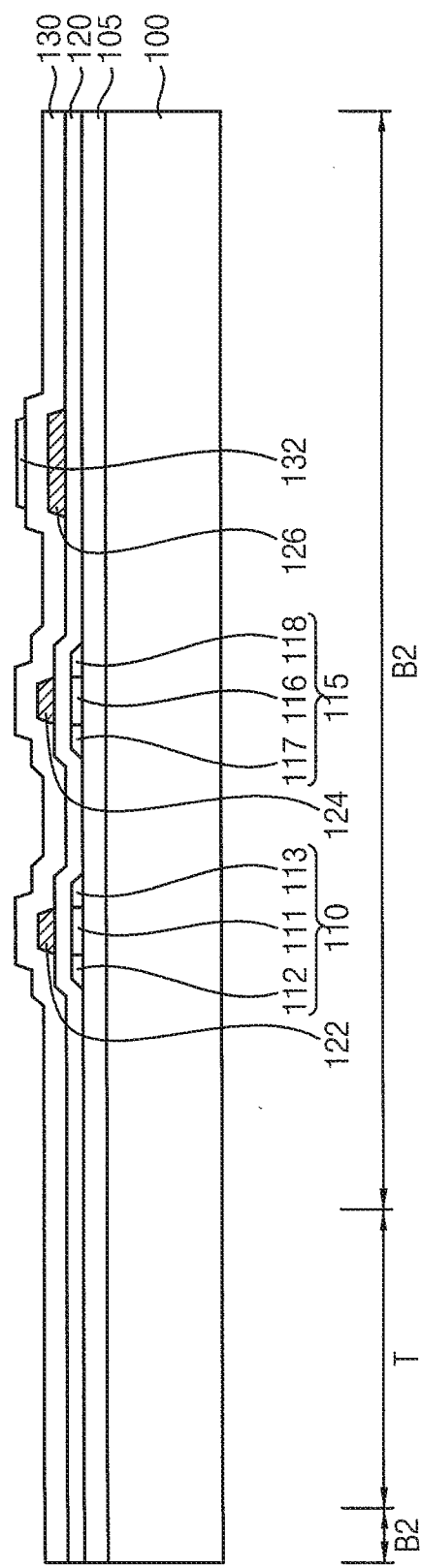

Referring to FIG. 10, a second conductive pattern 132 is formed on the first insulating interlayer 130 to overlap the first conductive pattern 126. The second conductive pattern 132 may include a metal such as aluminum (Al), copper (Cu), tungsten (W), chromium (Cr), or a conductive metal oxide such as indium tin oxide (ITO). In more detail, when the second conductive pattern 132 includes ITO, the second conductive pattern 132 may have a relatively low electrical resistance and a relatively high mechanical strength.

The first conductive pattern 126, the second conductive pattern 132, and the first insulating interlayer 130 disposed therebetween may constitute a first capacitor. For example, in some embodiments, the first capacitor may be the storage capacitor or the C-hold capacitor described above with reference to FIG. 2.

Figure 11:
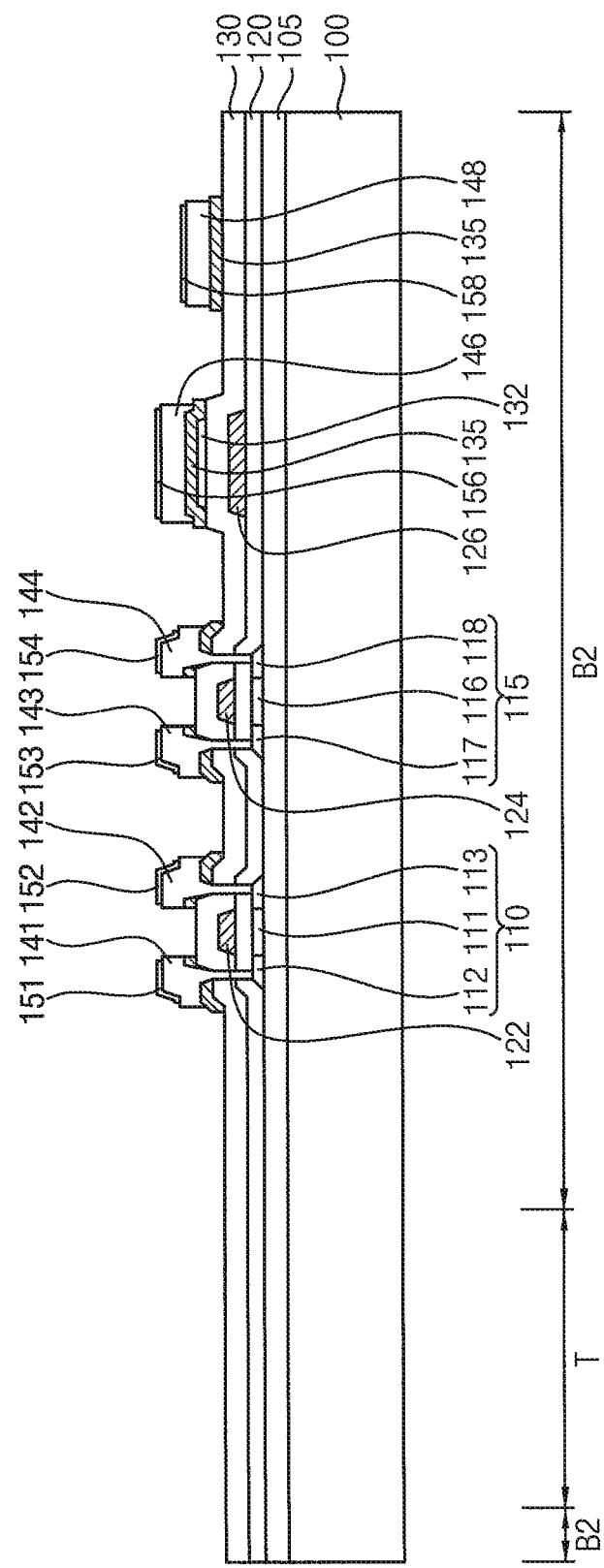

Referring to FIG. 11, second insulating interlayer patterns 135, a first source electrode 142 and 152, a first drain electrode 141 and 151, a second source electrode 144 and 154, a second drain electrode 143 and 153, and third, fourth, fifth, and sixth conductive patterns 146, 156, 148, and 158 are formed on the first insulating interlayer 130 and second conductive pattern 132.

In more detail, a second insulating interlayer may be formed on the first insulating interlayer 130, and the gate insulation layer 120, the first insulating interlayer 130, and the second insulating interlayer may be partially removed to form contact holes exposing the first and second source regions 113 and 118, and the first and second drain regions 112 and 117. A second conductive layer and a third conductive layer may be sequentially formed on the second insulating interlayer to fill the contact holes.

Then, the second insulating interlayer, the second conductive layer, and the third conductive layer may be partially removed to concurrently (e.g., simultaneously) form the second insulating interlayer patterns 135, the first source electrode 142 and 152, the first drain electrode 141 and 151, the second source electrode 144 and 154, the second drain electrode 143 and 153, and the third, fourth, fifth, and sixth conductive patterns 146, 156, 148, and 158. For example, the second insulating interlayer may be etched during a process for etching the second conductive layer and the third conductive layer.

The first source electrode 142 and 152, and the first drain electrode 141 and 151 may constitute a first transistor in conjunction with the first semiconductor pattern 110 and the first gate electrode 122. In addition, the second source electrode 144 and 154 and the second drain electrode 143 and 153 may constitute a second transistor in conjunction with the second semiconductor pattern 115 and the second gate electrode 124.

In some embodiments, the second insulating interlayer patterns 135 may be formed, for example, using silicon nitride. During a deposition process for forming the second insulating interlayer, hydrogen atoms or hydrogen molecules may be generated in the second insulating interlayer. The hydrogen atoms or hydrogen molecules may migrate into the first and second semiconductor patterns 110 and 115, so that damaged portions of the first and second semiconductor patterns 110 and 115 may be cured. In some embodiments, the first source electrode 142 and 152, the first drain electrode 141 and 151, the second source electrode 144 and 154, and the second drain electrode 143 and 153 may have a multi-layer structure including different conductive materials.

Referring now to FIG. 11, the third conductive pattern 146 and the fourth conductive pattern 156 are formed on one of the second insulating interlayer patterns 135 to overlap the second conductive pattern 132. The third and fourth conductive patterns 146 and 156, the second conductive pattern 132, and one of the second insulating interlayer patterns 135 disposed therebetween may constitute a second capacitor. When the second insulating interlayer pattern 135 includes silicon nitride, the second capacitor may have a higher capacitance, as compared to the case where the second insulating interlayer pattern 135 includes silicon oxide. In some embodiments, the second capacitor may be the storage capacitor or the C-hold capacitor described above with reference to FIG. 2.

In the embodiment of FIG. 11, the first conductive pattern 126, the second conductive pattern 132, the third conductive pattern 146, and the fourth conductive pattern 156 are disposed to overlap each other, so that the first capacitor and the second capacitor overlap each other. Accordingly, an opening ratio of the organic light emitting display device may increase.

In FIG. 11, the fifth conductive pattern 148 and the sixth conductive pattern 158 are disposed on one of the second insulating interlayer patterns 135. In some embodiments, the fifth conductive pattern 148 and the sixth conductive pattern 158 may serve as a contact pad for the data line DL, the gate line GL, or the power line described above with reference to FIG. 2.

Figure 12:
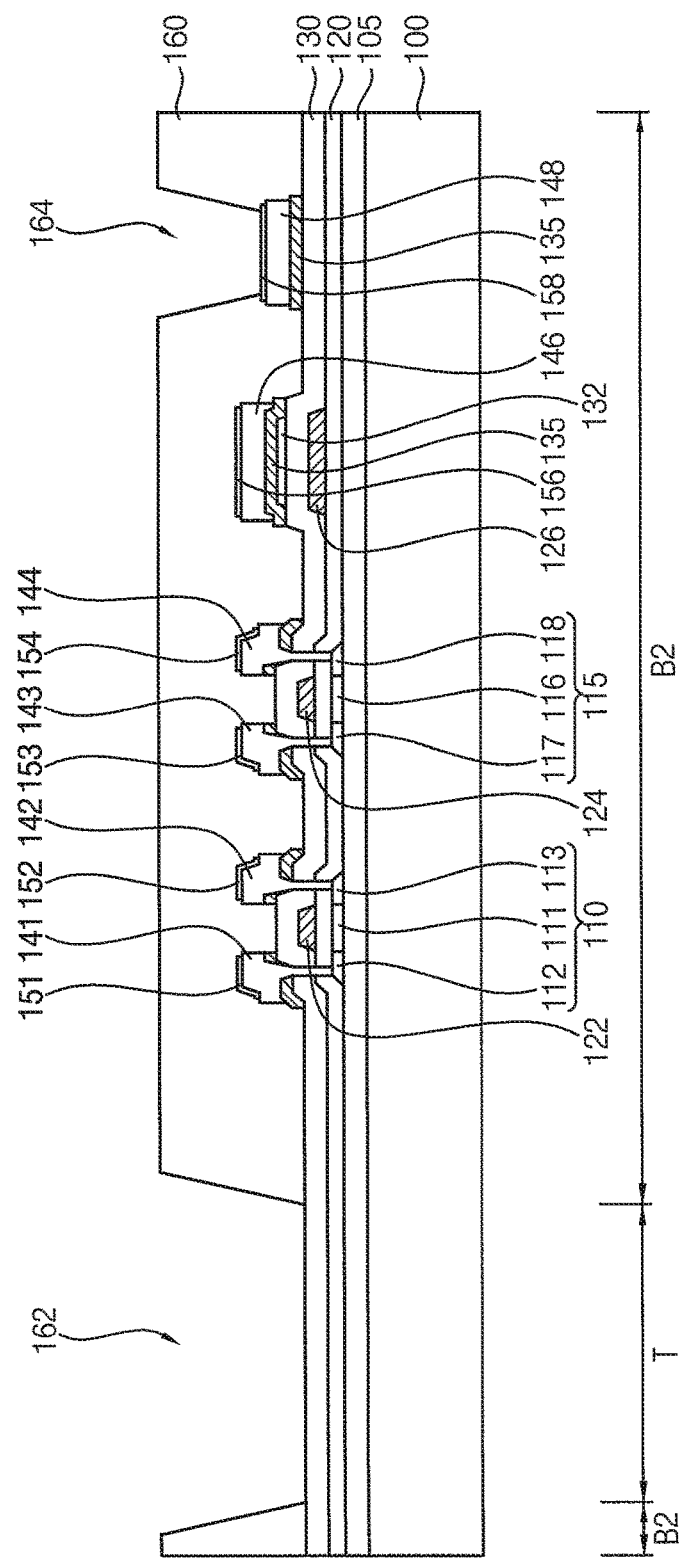

Referring to FIG. 12, a planarization layer 160 is formed on the first insulating interlayer 130 to cover the transistors and capacitors.

The planarization layer 160 may be formed, for example, by a coating process such as a spin coating process using an organic material such as polyimide, polyester, acryl, etc. The planarization layer 160 may have a substantially flat top surface. The planarization layer 160 may be formed, for example, using polyimide.

In FIG. 12, the planarization layer 160 is partially removed to form a first opening 162 and a second opening 164. The first opening 162 is disposed in the transparent region T. The second opening 164 exposes the sixth conductive pattern 158 in the light emitting region B2.

In the embodiment of FIG. 12, the first opening 162 is formed to expose a top surface of the first insulating interlayer 130 in the transparent region T. As such, the first opening 162 is defined by a top surface of the first insulating interlayer 130 and a sidewall of the exposed planarization layer 160.

In FIG. 12, during a process for forming the first opening 162, the first insulating interlayer 130 and the gate insulation layer 120 are not removed. As such, the first insulating interlayer 130 and the gate insulation layer 120 extend from the light emitting region B2 to the transparent region T. Accordingly, a sidewall of the first insulating interlayer 130 and a sidewall of the gate insulation layer 120 are not disposed in the transparent region T, so that sharpness of the organic light emitting display device may be improved as described above with reference to FIGS. 3 to 7.

Figure 13:
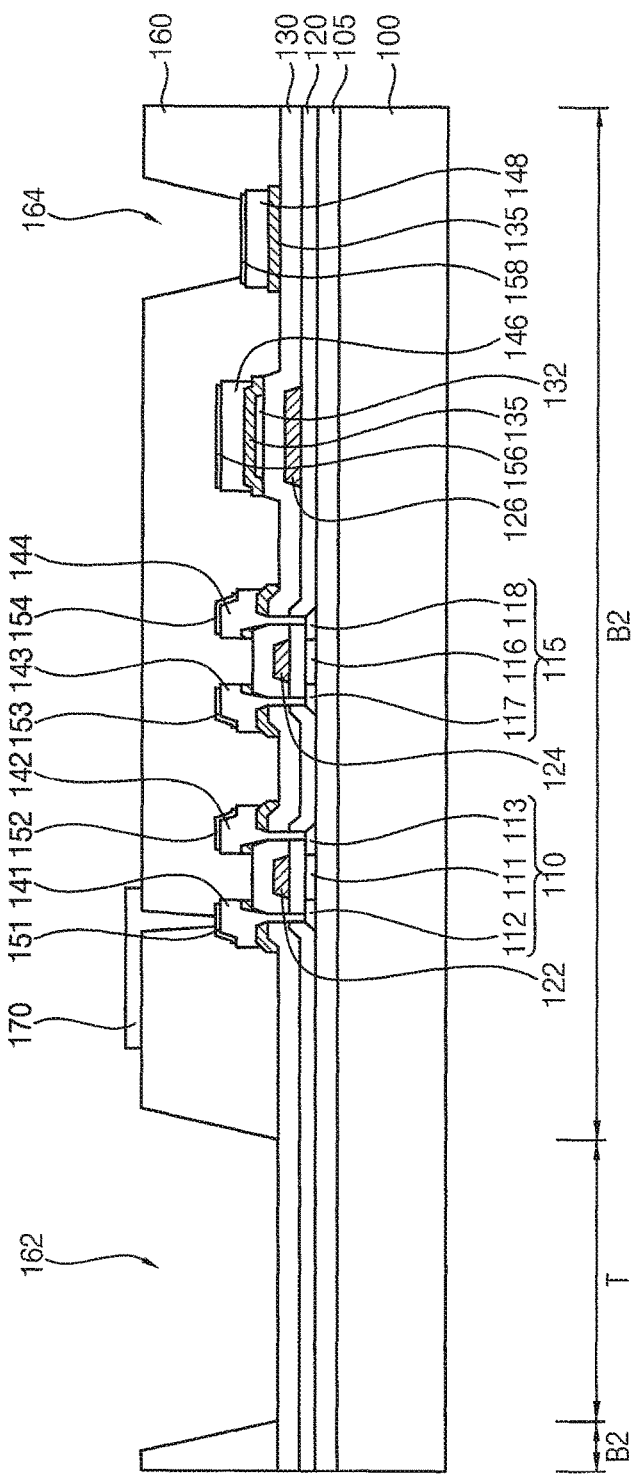

Referring to FIG. 13, a first electrode 170 is formed on the planarization layer 160. In more detail, the planarization layer 160 is partially removed to form a contact hole exposing the first drain electrode 151, a fourth conductive layer may be formed on the planarization layer 160 to fill the contact hole, and then the fourth conductive layer may be partially removed to form the first electrode 170. The first electrode 170 may be formed, for example, using a transparent conductive material such as indium tin oxide (ITO), indium zinc oxide (IZO), etc.

Figure 14:
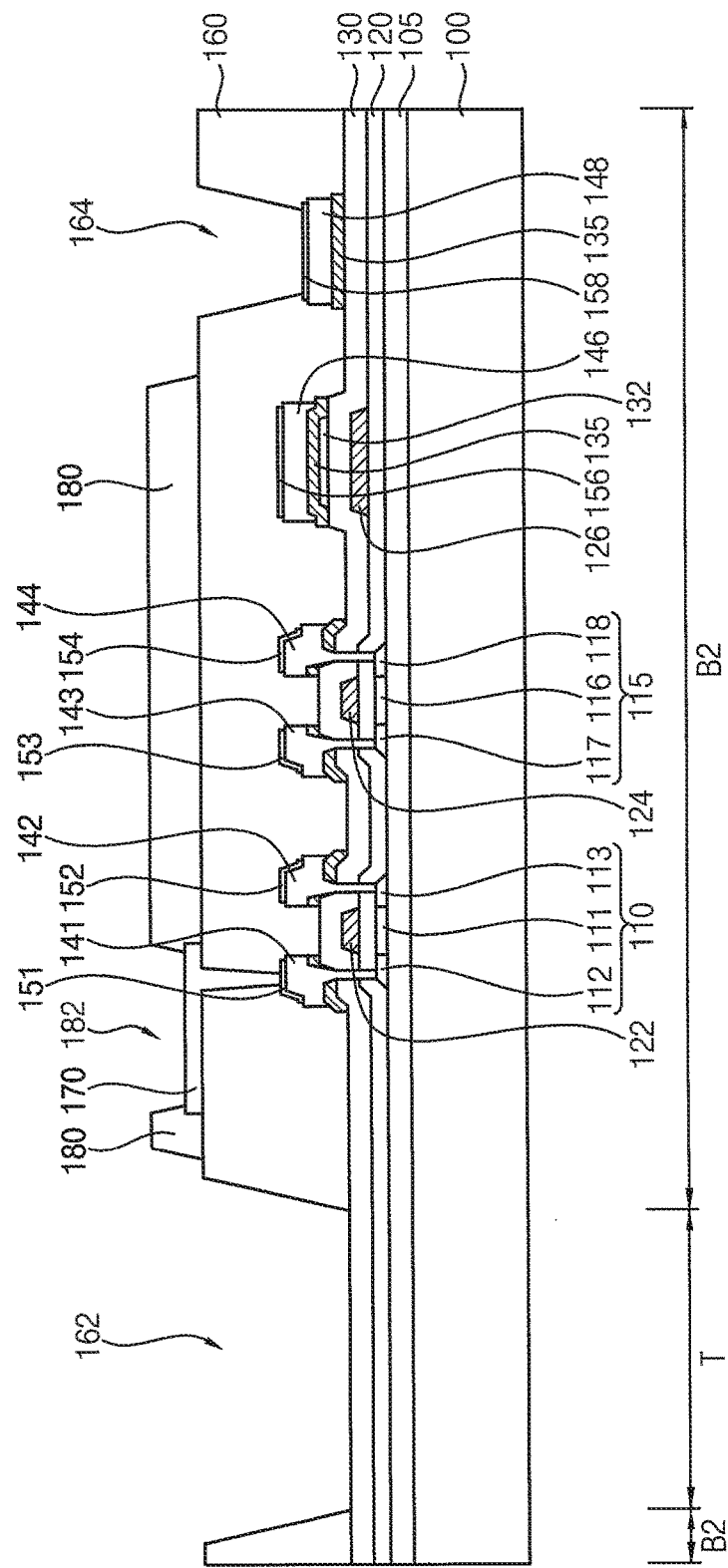

Referring to FIG. 14, a pixel defining layer 180 is formed on the planarization layer 160 to partially cover the first electrode 170. In the embodiment of FIG. 14, the pixel defining layer 180 is formed in the light emitting region B2, and is not formed in the transparent region T. As such, the pixel defining layer 180 is not formed on a bottom surface or a sidewall of the first opening 162.

Accordingly, a sidewall of the pixel defining layer 180 is not disposed in the transparent region T, so that sharpness of the organic light emitting display device may be improved as described above with reference to FIGS. 3 to 7. Then, an organic layer structure including a light emitting layer and a second electrode may be formed to manufacture the organic light emitting display device.

FIGS. 15 to 20 are cross sectional views illustrating another method of manufacturing an organic light emitting display device in accordance with an embodiment of the present invention.

Figure 15:
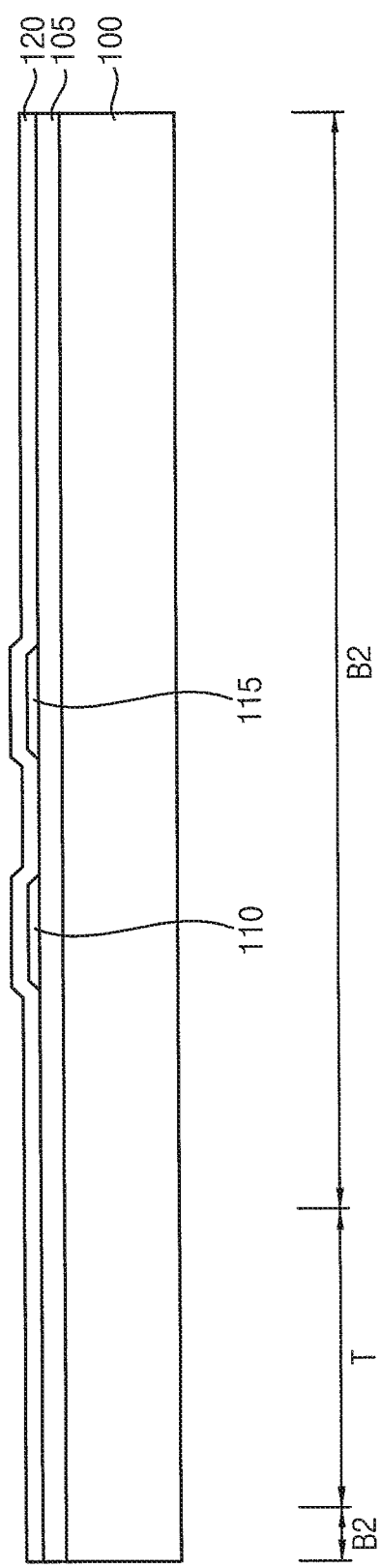
FIGS. 15 to 20 are cross sectional views illustrating another method of manufacturing an organic light emitting display device in accordance with an embodiment of the present invention.

Referring to FIG. 15, a barrier layer 105, first and second semiconductor patterns 110 and 115, and a gate insulation layer 120 are formed on a substrate 100. Processes for forming the barrier layer 105, the first and second semiconductor patterns 110 and 115, and the gate insulation layer 120 may be, for example, substantially similar to or identical to those described above with reference to FIG. 9.

Figure 16:
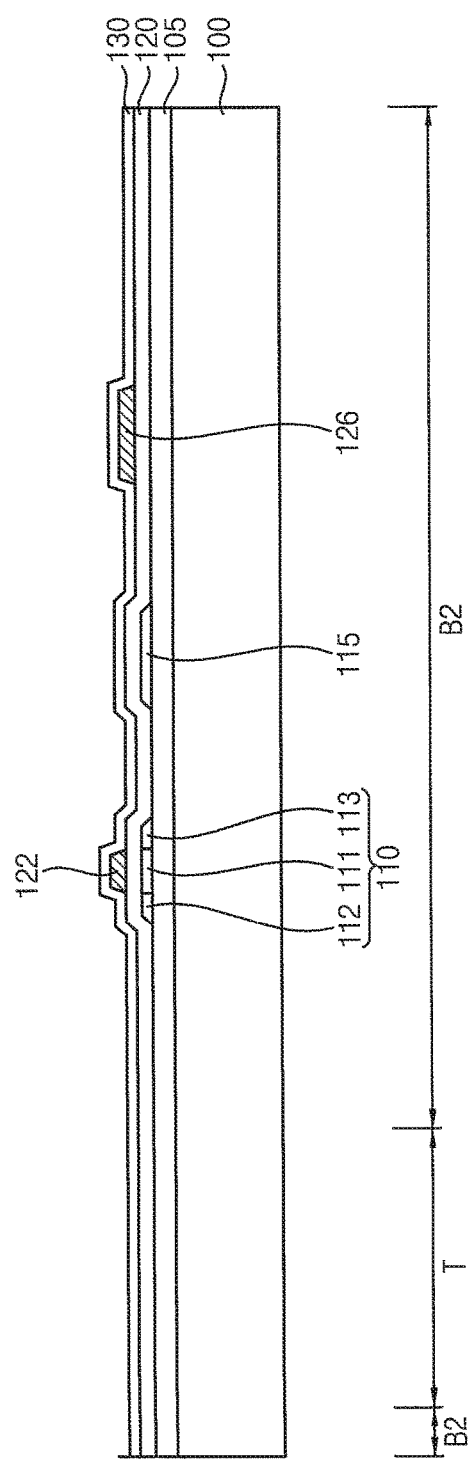

Referring to FIG. 16, a first gate electrode 122 and a first conductive pattern 126 may be formed on the gate insulation layer 120. In more detail, a first conductive layer may be formed on the gate insulation layer 120, and the first conductive layer may be partially removed to concurrently (e.g., simultaneously) form the first gate electrode 122 and the first conductive pattern 126. In the embodiment of FIG. 16, the first gate electrode 122 partially overlaps the first semiconductor pattern 110, and the first conductive pattern 126 does not overlap the first and second semiconductor patterns 110 and 115.

Then, in FIG. 16, a first insulating interlayer 130 is formed on the gate insulation layer 120 to cover the first gate electrode 122 and the first conductive pattern 126. The first insulating interlayer 130 may be formed, for example, using silicon oxide.

Impurities may be implanted into the first semiconductor pattern 110 by using the first gate electrode 122 as an ion implantation mask. As such, the first semiconductor pattern 110 may include a first source region 113, a first drain region 112, and a first channel region 111 disposed therebetween.

Figure 17:
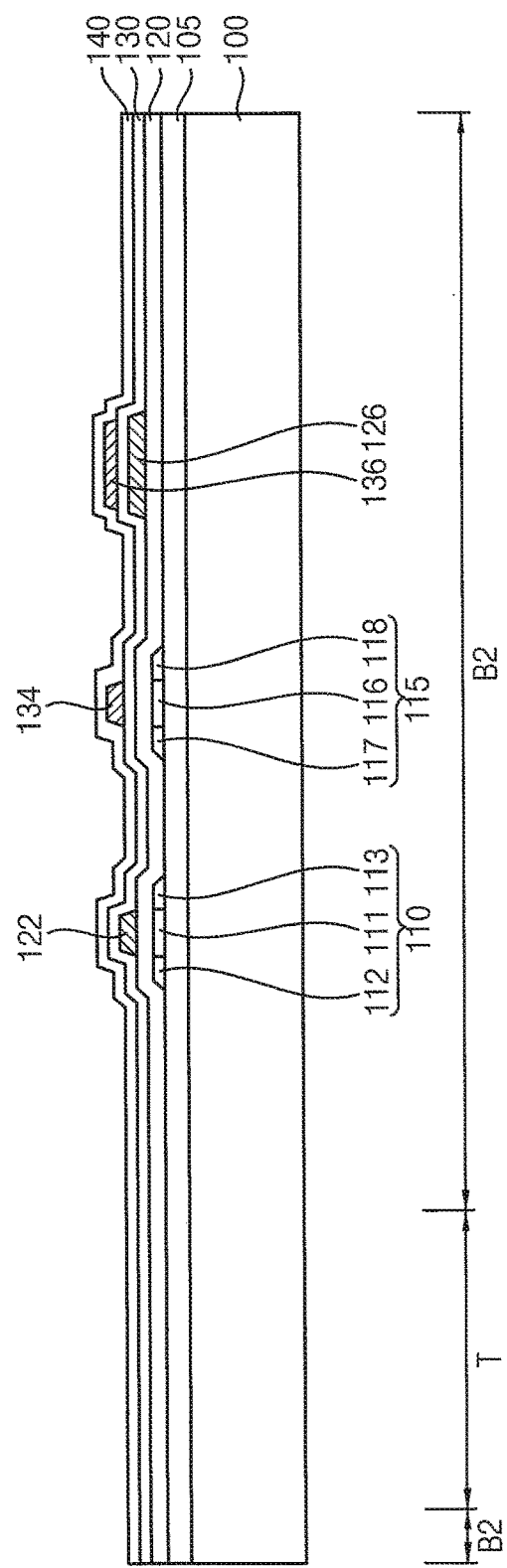

Referring to FIG. 17, a second gate electrode 134 and a second conductive pattern 136 are formed on the first insulating interlayer 130. In more detail, a second conductive layer may be formed on the first insulating interlayer 130, and then the second conductive layer may be partially removed to concurrently (e.g., simultaneously) form the second gate electrode 134 and the second conductive pattern 136.

In the embodiment of FIG. 17, the second gate electrode 134 partially overlaps the second semiconductor pattern 115, and the second conductive pattern 136 may overlap the first conductive pattern 126. The first conductive pattern 126, the second conductive pattern 132, and the first insulating interlayer 130 disposed therebetween may constitute a first capacitor. In some embodiments, the first capacitor may be the storage capacitor or the C-hold capacitor described above with reference to FIG. 2.

Then, in FIG. 17, a second insulating interlayer 140 is formed on the first insulating interlayer 130 to cover the second gate electrode 134 and the second conductive pattern 136. The second insulating interlayer 140 may include, for example, silicon oxide.

Further, impurities may be implanted into the second semiconductor pattern 115 by using the second gate electrode 124 as an ion implantation mask. As such, the second semiconductor pattern 115 may include a second source region 118, a second drain region 117, and a second channel region 116 disposed therebetween.

Figure 18:
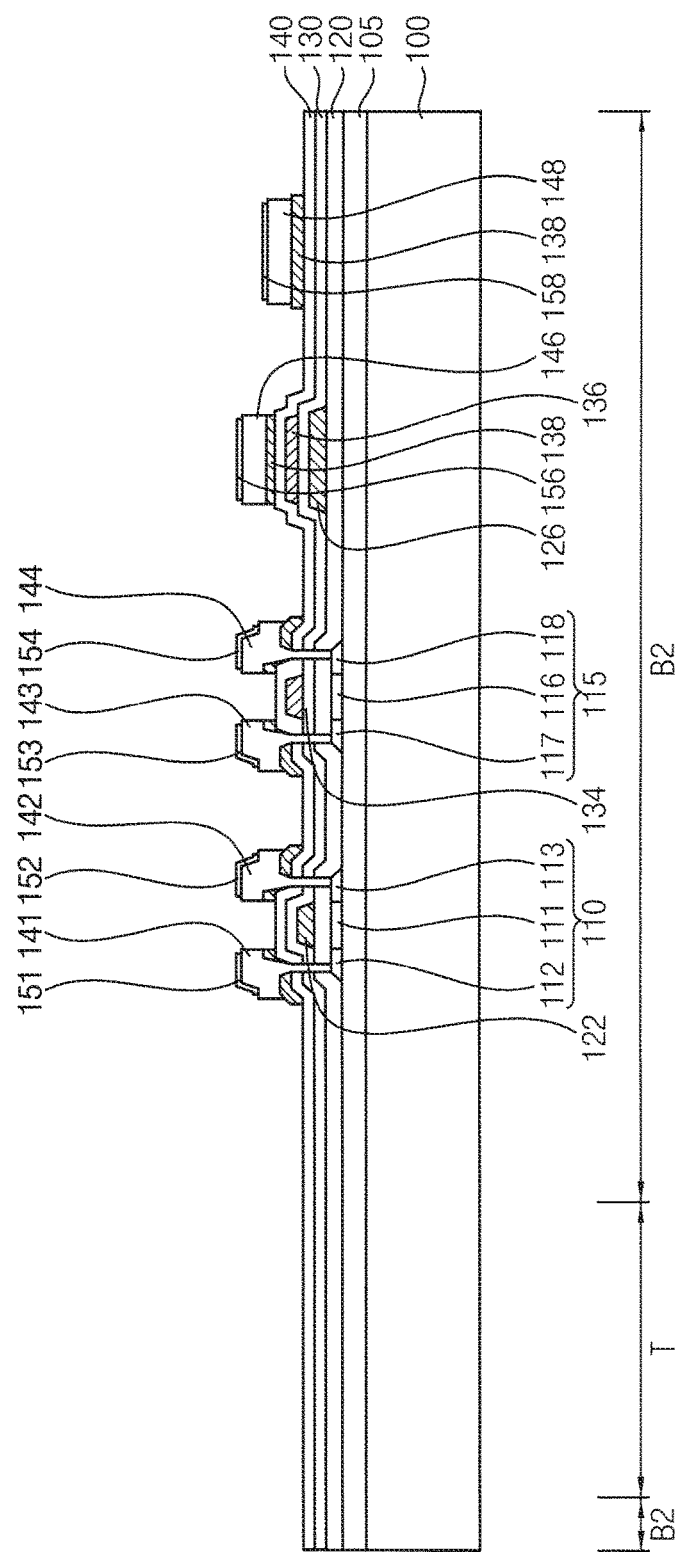

Referring to FIG. 18, third insulating interlayer patterns 138, a first source electrode 142 and 152, a first drain electrode 141 and 151, a second source electrode 144 and 154, a second drain electrode 143 and 153, and third, fourth, fifth, and sixth conductive patterns 146, 156, 148, and 158 are formed on the first insulating interlayer 130. These processes may be, for example, substantially similar to those described above with reference to FIG. 11 (e.g., the third insulating interlayer patterns 138 of FIG. 18 may be formed in a substantially similar way to the second insulating interlayer patterns 135 of FIG. 11).

In some embodiments, the third insulating interlayer patterns 138 may be formed, for example, using silicon nitride. During a deposition process for forming the second insulating interlayer 140, hydrogen atoms or hydrogen molecules may be generated in the second insulating interlayer 140. The hydrogen atoms or hydrogen molecules may migrate into the first and second semiconductor patterns 110 and 115, so that damaged portions of the first and second semiconductor patterns 110 and 115 may be cured.

Further, in FIG. 18, the third insulating interlayer patterns 138 are disposed where the first source electrode 142 and 152, the first drain electrode 141 and 151, the second source electrode 144 and 154, the second drain electrode 143 and 153, and the third, fourth, fifth, and sixth conductive patterns 146, 156, 148, and 158 are disposed. As such, the third insulating interlayer patterns 138 may only partially cover the light emitting region B2, so that transparency of the organic light emitting display device may be improved from about 3% to about 5%.

Further, the first source electrode 142 and 152, and the first drain electrode 141 and 151 may constitute a first transistor in conjunction with the first semiconductor pattern 110 and the first gate electrode 122. The second source electrode 144 and 154 and the second drain electrode 143 and 153 may constitute a second transistor in conjunction with the second semiconductor pattern 115 and the second gate electrode 134. As such, a distance between the second semiconductor pattern 115 and the second gate electrode 134 may be greater than a distance between the first semiconductor pattern 110 and the first gate electrode 122.

In some embodiments, the first source electrode 142 and 152, the first drain electrode 141 and 151, the second source electrode 144 and 154, and the second drain electrode 143 and 153 may have a multi-layer structure including different conductive materials.

Referring now to FIG. 18, the third conductive pattern 146 and the fourth conductive pattern 156 are formed on one of the third insulating interlayer patterns 138 to overlap the second conductive pattern 136. Therefore, the third and fourth conductive patterns 146 and 156, the second conductive pattern 136, and the third insulating interlayer pattern 138 disposed therebetween may constitute a second capacitor.

According to the embodiment of FIG. 18, the first capacitor and the second capacitor overlap each other. Accordingly, an opening ratio of the organic light emitting display device may increase.

Figure 19:
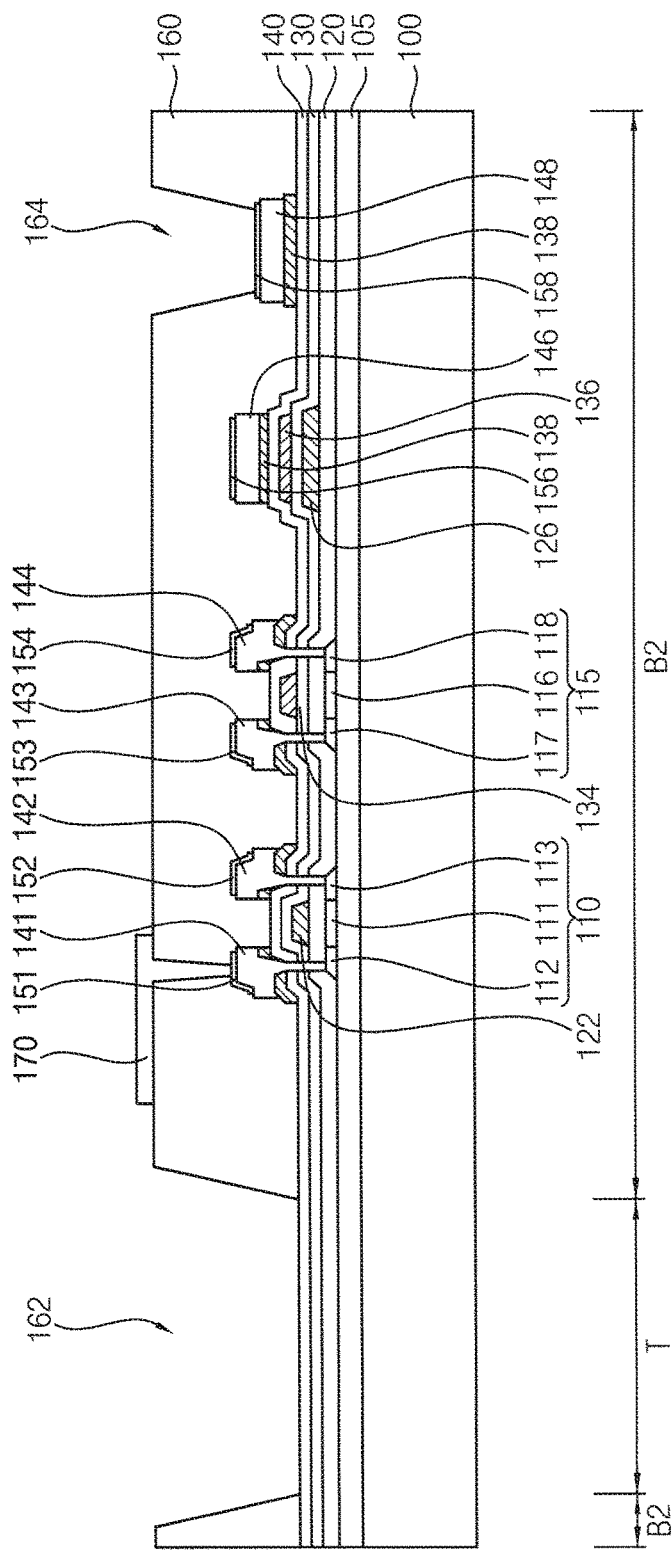

Referring to FIG. 19, a planarization layer 160 is formed on the second insulating interlayer 140 to cover the transistors and capacitors, and a first electrode 170 is formed on the planarization layer 160. These processes may be substantially similar, for example, to those described above with reference to FIGS. 12 and 13.

In FIG. 19, the planarization layer 160 is partially removed to form a first opening 162 and a second opening 164. In the embodiment of FIG. 19, the first opening 162 is formed to expose a top surface of the second insulating interlayer 140 in the transparent region T. That is, the first opening 162 may be defined by a top surface of the second insulating interlayer 140 and a sidewall of the exposed planarization layer 160. That is, a sidewall of the second insulating interlayer 140, a sidewall of the first insulating interlayer 130, and a sidewall of the gate insulation layer 120 are not disposed in the transparent region T, so that sharpness of the organic light emitting display device may be improved as described above with reference to FIGS. 3 to 7.

Figure 20:
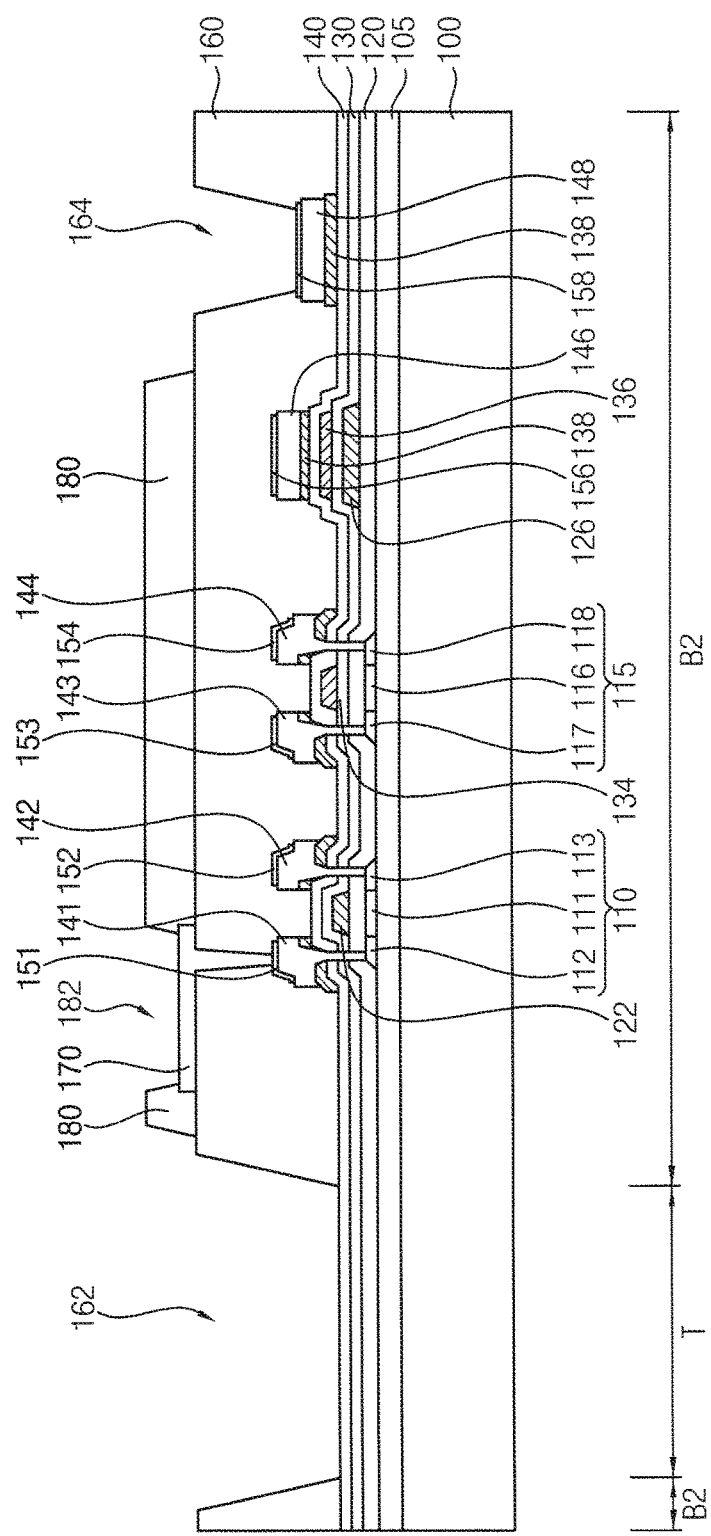

Referring to FIG. 20, a pixel defining layer 180 is formed on the planarization layer 160 to partially cover the first electrode 170. These processes may be substantially similar, for example, to those described above with reference to FIG. 14.

In the embodiment of FIG. 20, the pixel defining layer 180 is formed in the light emitting region B2, and not formed in the transparent region T. As such, in FIG. 20, the pixel defining layer 180 is not formed on a bottom surface or a sidewall of the first opening 162. In FIG. 20, a sidewall of the pixel defining layer 180 is not disposed in the transparent region T, so that sharpness of the organic light emitting display device may be improved as described above with reference to FIGS. 3 to 7. Then, an organic layer structure including a light emitting layer and a second electrode may be formed to manufacture the organic light emitting display device.

The foregoing description is illustrative of example embodiments of the present invention, and is not to be construed as limiting thereof. Although a few example embodiments have been described, those skilled in the art will readily appreciate that many modifications are possible without materially departing from the novel teachings and aspects of the present invention.

Accordingly, all such modifications are intended to be included within the scope of the present invention as defined in the claims that follow. In the claims, means-plus-function clauses are intended to cover the structures described herein as performing the recited function and not only structural equivalents but also equivalent structures. Therefore, it is to be understood that the foregoing is illustrative of example embodiments of the present invention and is not to be construed as limited to the specific embodiments disclosed, and that modifications to the disclosed embodiments, as well as other embodiments, are intended to be included within the scope of the present invention. The present invention is defined by the following claims, with equivalents of the claims to be included therein.

What is claimed is:

1. A method of manufacturing an organic light emitting display device, the method comprising:
    forming a first semiconductor pattern on a substrate including a plurality of pixel regions each including a light emitting region and a transparent region between the light emitting region and another light emitting region of another pixel region of the pixel regions;
    forming a gate insulation layer to cover the first semiconductor pattern;
    forming a first gate electrode on the gate insulation layer and partially overlapping the first semiconductor pattern;
    forming a first insulating interlayer covering the first gate electrode and extending from the light emitting region to the transparent region;
    forming a first drain electrode and a first source electrode above the first insulating interlayer, the first drain electrode and the first source electrode constituting a first transistor in conjunction with the first gate electrode;
    forming a planarization layer covering the first drain electrode and the first source electrode, the planarization layer exposing a top surface of the first insulating interlayer in the transparent region; and
    forming a first electrode on the planarization layer.

2. The method of claim 1, wherein the forming of the first gate electrode further comprises forming a first conductive pattern on the gate insulation layer.

3. The method of claim 2, wherein the forming of the first drain electrode and the first source electrode further comprises forming a third conductive pattern overlapping the first conductive pattern.

4. A method of manufacturing an organic light emitting display device, the method comprising:
    forming a first semiconductor pattern on a substrate including a plurality of pixel regions each including a light emitting region and a transparent region;
    forming a gate insulation layer to cover the first semiconductor pattern;
    forming a first gate electrode on the gate insulation layer and partially overlapping the first semiconductor pattern by forming a first conductive pattern on the gate insulation layer;
    forming a first insulating interlayer covering the first gate electrode and extending from the light emitting region to the transparent region;
    forming a first drain electrode and a first source electrode above the first insulating interlayer by forming a third conductive pattern overlapping the first conductive pattern, the first drain electrode and the first source electrode constituting a first transistor in conjunction with the first gate electrode;

forming a planarization layer covering the first drain electrode and the first source electrode, the planarization layer exposing a top surface of the first insulating interlayer in the transparent region;

forming a first electrode on the planarization layer;

forming a second conductive pattern on the first insulating interlayer and overlapping the first conductive pattern; and forming second insulating interlayer patterns on the first insulating interlayer, one of the second insulating interlayer patterns covering the second conductive pattern.

5. The method of claim 4, wherein the forming of the second insulating interlayer patterns comprises:

forming a second insulating interlayer on the first insulating interlayer using silicon nitride; and partially removing the second insulating interlayer in the light emitting region.

6. The method of claim 5, wherein the forming of the planarization layer comprises:

forming an organic layer in the transparent region and the light emitting region, the organic layer covering the first drain electrode and the first source electrode; and partially removing the organic layer to form a first opening defined by a top surface of the first insulating interlayer and a sidewall of the organic layer.

* * * * *